US011860242B2

(12) United States Patent
Raghavan et al.

(10) Patent No.: US 11,860,242 B2
(45) Date of Patent: Jan. 2, 2024

(54) OPTICAL MONITORING FOR POWER GRID SYSTEMS

(71) Applicant: Palo Alto Research Center Incorporated, Palo Alto, CA (US)

(72) Inventors: Ajay Raghavan, Mountain View, CA (US); Peter Kiesel, Palo Alto, CA (US)

(73) Assignee: XEROX CORPORATION, Norwalk, CT (US)

(*) Notice: Subject to any disclaimer, the term of this patent is extended or adjusted under 35 U.S.C. 154(b) by 0 days.

(21) Appl. No.: 17/552,790

(22) Filed: Dec. 16, 2021

(65) Prior Publication Data
US 2022/0107367 A1 Apr. 7, 2022

Related U.S. Application Data

(63) Continuation of application No. 15/643,427, filed on Jul. 6, 2017, now abandoned.

(51) Int. Cl.
*G01R 31/62* (2020.01)
*G01B 11/16* (2006.01)
*H04B 3/46* (2015.01)
*G01J 3/18* (2006.01)
*G02B 6/293* (2006.01)
*G01L 1/24* (2006.01)
(Continued)

(52) U.S. Cl.
CPC .............. *G01R 31/62* (2020.01); *G01B 11/18* (2013.01); *G01J 3/00* (2013.01); *G01J 3/1895* (2013.01); *G01L 1/246* (2013.01); *G01R 19/2513* (2013.01); *H04B 3/46* (2013.01); *G01D 5/353* (2013.01); *G02B 6/12009* (2013.01); *G02B 6/2938* (2013.01)

(58) Field of Classification Search
CPC .................................................... G01R 31/027
See application file for complete search history.

(56) References Cited

U.S. PATENT DOCUMENTS

2003/0118297 A1  6/2003 Dunphy et al.
2008/0266564 A1  10/2008 Themelis
(Continued)

FOREIGN PATENT DOCUMENTS

EP     2975366      1/2016
WO    2016/168621   10/2016

OTHER PUBLICATIONS

Amin et al., "Toward a smart grid: power delivery for the 21st century," IEEE power and energy magazine, 3(5), pp. 34-41, 2005.
(Continued)

*Primary Examiner* — Noam Reisner
(74) *Attorney, Agent, or Firm* — Mueting Raasch Group

(57) ABSTRACT

A monitoring system for a power grid includes one or more power transformer monitors. Each power transformer monitor includes a plurality of optical sensors disposed on one or more optical fibers that sense parameters of the power transformer. Each optical sensor is configured to sense a power transformer parameter that is different from a power transformer parameter sensed by at least one other sensor of the plurality of optical sensors. An optical coupler spatially disperses optical signals from the optical sensors according to wavelength. A detector unit converts optical signals of the optical sensors to electrical signals representative of the sensed power transformer parameters.

20 Claims, 11 Drawing Sheets

(51) Int. Cl.
 G01J 3/00 (2006.01)
 G01R 19/25 (2006.01)
 G01D 5/353 (2006.01)
 G02B 6/12 (2006.01)

(56) References Cited

U.S. PATENT DOCUMENTS

| | | | |
|---|---|---|---|
| 2014/0091781 A1 | 4/2014 | Cova et al. | |
| 2014/0092375 A1* | 4/2014 | Raghavan | H01M 10/48 356/32 |
| 2014/0321799 A1* | 10/2014 | Udd | G02B 6/022 385/13 |
| 2016/0003782 A1 | 1/2016 | Von Herzen et al. | |
| 2016/0018319 A1 | 1/2016 | Hegyi et al. | |

OTHER PUBLICATIONS

Berger, "Dielectric strength of insulating materials," Carbon, 1, p. 2, 2006.
Chen et al., "Analysis of voltage profile problems due to the penetration of distributed generation in low-voltage secondary distribution networks," IEEE Transactions on Power Delivery, 27(4), pp. 2020-2028, 2012.
Cohen et al., "Economic Effects of Distributed PV Generation on California's Distribution System," Energy Institute at Hass Working Paper—260, 2015.
Donohue et al., "Long Island City Network Jul. 17-25, 2006," Incident Investigation Committee Report, Consolidated Edison Co. of New York, 2007.
EUROPIC (European Manufacturing Platform for Photonic Integrated Circuits) project final report, 2013.
Godina et al., "Effect of loads and other key factors on oil-transformer ageing: sustainability benefits and challenges," Energies, 8(10), pp. 12147-12186, 2015.
Gungor et al., "Opportunities and challenges of wireless sensor networks in smart grid," IEEE Transactions on Industrial Electronics, 57(10), pp. 3557-3564, 2010.
Gungor et al., "A survey on communication networks for electric system automation," Comput. Netw., vol. 50, No. 7, pp. 877-897, May 2006.
Hilshey et al., "Estimating the impact of electric vehicle smart charging on distribution transformer aging," IEEE Transactions on Smart Grid, 4(2), pp. 905-913, 2013.
Klonari et al., "Estimating the Photovoltaic Hosting Capacity of a Low Voltage Feeder Using Smart Meters' Measurements," Smart Meters Architecture and Applications, 2016.
Martinez et al., "Direct writing of fibre Bragg gratings by femtosecond laser," Electronics Letters, 40(19), p. 1, 2004.
McDonald et al., "Distribution Systems, Substations, and Integration of Distributed Generation", Encyclopedia of Sustainability Science and Technology, 63 pages, 2013.
Minhas et al, "Using fault augmented modelica models for diagnostics", In Proceedings of the 10th International Modelica Conference; Mar. 10-12, 2014; Lund; Sweden (No. 96, pp. 437-445).
Nellen et al. "Reliability of fiber Bragg grating based sensors for downhole applications," Sensors and Actuators A: Physical, 103(3), pp. 364-376, 2003.
Pezeshki et al. "Impact of high PV penetration on distribution transformer insulation life," IEEE Transactions on Power Delivery, 29(3), pp. 1212-1220, 2014.
Posada-Roman et al., "Fiber optic sensor for acoustic detection of partial discharges in oil-paper insulated electrical systems," Sensors, 12(4), pp. 4793-4802, 2012.
Saha et al., "Uncertainty management for diagnostics and prognostics of batteries using Bayesian techniques", Proc. IEEE Aerospace Conference, pp. 1-8, 2008.
Schuh et al., "High-resolution, high-frequency wavelength shift detection of optical signals with low-cost, compact readouts," In SPIE Sensing Technology+ Applications (pp. 94800B-94800B), Jun. 2015.
Shmilovitz et al., "Characteristics of modern nonlinear loads and their influence on systems with distributed generation," International journal of Energy Technology and Policy, 5(2), pp. 219-240, 2007.
Udd et al. "Fiber optic distributed sensing systems for harsh aerospace environments," Proc. SPIE(3674-136), 1999.
U.S. Department of Energy, "Report on the First Quadrennial Technology Review," United States Department of Energy, Washington, DC (2011).
Wang et al, "Cyber security in the Smart Grid: Survey and challenges," Computer Networks, 57(5), pp. 1344-1371, 2013.
Yang et al., "A survey on technologies for implementing sensor networks for power delivery systems," in Proc. IEEE Power Eng. Soc. Gen. Meeting, pp. 1-8, Jun. 2007.
Bellmann et al., "Compact and fast read out for wavelength-encoded biosensors," in MOEMS-MEMS. International Society for Optics and Photonics, 7593: 759302, 2010.
Emsley et al.,"Review of Chemical Indicators of Degradation of Cellulosic Electrical Paper Insulation in Oil-filled Transformers", IEEE Proc. Sci. Measur. Techn., vol. 141, pp. 324_334, 1994.
Huang et al., "State estimation in electric powergrids: Meeting new challenges presented by the requirements of the future grid," IEEE Signal Processing Magazine, 29(5), pp. 33-43, 2012.
Kai et al., "Analysis and research of Grounding Modes of Optical Fiber Ground Composite Wire [J]," High Voltage Engineering, 9, p. 020, 2008.
Kazerooni et al., "Optimal load management of EV battery charging and optimization of harmonic impacts on distribution transformers," In Electrical & Computer Engineering (CCECE), 2012 25th IEEE Canadian Conference on (pp. 1-4). IEEE, Apr. 2012.
Li et al., "Recent applications of fiber optic sensors to health monitoring in civil engineering," Engineering structures, 26(11), pp. 1647-1657, 2004.
Liu et al., "Homogenized Magnetoelastic Behavior Model for the Computation of Strain Due to Magnetostriction in Transformers," IEEE Transactions on Magnetics, 52(2), pp. 1-12, 2016.
Lundgaard, "Partial discharge-part XIII: Acoustic partial discharge detection—Fundamental Considerations", IEEE Electr. Insul. Mag., 8, 25-31, 1992.
McGinn et al. "Reducing conventional copper signaling in high voltage substations with IEC 61850 process bus system," In PowerTech, 2009 IEEE Bucharest (pp. 1-8). IEEE, Jun. 2009.
McGranaghan et al., "Technical and system requirements for advanced distribution automation," In 18th International Conference and Exhibition on Electricity Distribution (vol. 5, p. 93), Jun. 2005.
Merzbacher et al., "Fiber optic sensors in concrete structures: a review," Smart Materials and Structures, 5(2), p. 196, 1996.
Palen, "Surface mount optical interconnects," Integrated Optoelectronic Devices, pp. 68990B-68990B, International Society for Optics and Photonics, 2008.
Ribeiro et al., "Multipoint fiber-optic hot-spot sensing network integrated into high power transformer for continuous monitoring," IEEE Sensors Journal, 8(7), pp. 1264-1267, 2008.
Rivera et al., "Measurements of mechanical vibrations at magnetic cores of power transformers with fiber-optic interferometric intrinsic sensor," IEEE Journal of Selected Topics in Quantum Electronics, 6(5), pp. 788-797, 2000.
Sommer et al., "Fast and slow ion diffusion processes in lithium ion pouch cells during cycling observed with fiber optic strain sensors," Journal of Power Sources, 296, pp. 46-52, 2015.
Sommer et al., "Monitoring of Intercalation Stages in Lithium-Ion Cells over Charge-Discharge Cycles with Fiber Optic Sensors," Journal of The Electrochemical Society, 162(14),pp. A2664-A2669, 2015.
Stone, "Partial discharge diagnostics and electrical equipment insulation condition assessment," IEEE Trans. Dielectr. Electr. Insul., 12, 891-903, 2005.
Teunissen et al., "Stability of fiber Bragg grating sensors for integration into high-voltage transformers for online monitoring," In Optical Fiber Sensors Conference Technical Digest, 2002. Ofs 2002, 15th (pp. 541-544). IEEE, May 2002.

(56) References Cited

OTHER PUBLICATIONS

U.S. Department of Energy, "Assessment study on sensors and automation in the industries of the future," Office of Energy and Renewable Energy Rep., 2004.

Wang et al., "Review of condition assessment of power transformers in service," IEEE Electrical Insulation Magazine, 18(6), pp. 12-25, 2002.

Yang et al., "Power line sensornet—A new concept for power grid monitoring," in Proc. IEEE Power Eng. Soc. Gen. Meeting, pp. 1-8, Jun. 2006.

Yu et al., "Fiber Fabry-Perot sensors for detection of partial discharges in power transformers," Applied Optics, 42(16), pp. 3241-3250, 2003.

Zhang et al., "Dynamic deformation analysis of power transformer windings in short-circuit fault by FEM," IEEE Transactions on Applied Superconductivity, 24(3), pp. 1-4, 2014.

EP Search Report from EP Application No. 18180255.4 dated Dec. 5, 2018, 8 pages.

\* cited by examiner

OPTICAL MONITORING FOR POWER GRID SYSTEMS

RELATED APPLICATIONS

This application is a continuation of U.S. Ser. No. 15/643,427, filed Jul. 6, 2017, which is incorporated herein by reference in its entirety.

TECHNICAL FIELD

This application relates generally to techniques for optically monitoring power grid transmission and distribution systems. The application also relates to components, devices, systems, and methods pertaining to such techniques.

BACKGROUND

Global climate change and population growth are driving increased demands for reliable, sustainable, and clean electricity around the world. This is creating an even heavier burden on the already overstressed and aging global power infrastructure. Modern power grids are complex, tightly interconnected systems. Certain extraneous conditions at key locations can have unpredictable and immediate impacts over a wide area. The existing power grid suffers from a lack of effective distributed communications, monitoring, fault diagnostics, and automation, which further increase the possibility of wide-area breakdown due to cascading effects from a single fault.

SUMMARY

Various embodiments described herein involve systems and methods for monitoring power transmission and distribution systems. Some embodiments are directed to an optical monitoring system. The monitoring system includes one or more power transformer monitors. Each power distribution monitor includes a plurality of optical sensors disposed on one or more optical fibers. The optical sensors are configured to sense parameters, e.g., internal parameters, of a power transformer. Each optical sensor is disposed at a location within or on a power transformer and is configured to sense a transformer parameter that is different from a transformer parameter sensed by at least one other sensor of the plurality of optical sensors. The monitoring system includes one or more detector units. Each detector unit converts optical signals of the optical sensors of a corresponding power transformer monitor to electrical signals representative of the sensed transformer parameters. At least one optical coupler is disposed between the one or more optical fibers and the detector units. The optical coupler spatially disperses optical signals from the optical sensors according to wavelength.

Some embodiments involve a method for monitoring optically power grid transmission and/or distribution components. Multiple parameters of a power transformer are sensed using multiple optical sensors on an optical fiber disposed within or on the power transformer. At least one of the optical sensors senses a different parameter than others of the optical sensors. The optical output signals from each sensor are combined into a combined optical signal that is carried on the optical fiber. The combined optical signal is spatially dispersed according to wavelength. Electrical signals are generated in response to the spatially dispersed combined optical output signal. The electrical signals represent the sensed parameters of the power transformer.

According to some aspects, the electrical signals are analyzed to predict, detect and/or diagnose one or more of a functional condition, a state, and/or a degradation condition of the power transformer.

BRIEF DESCRIPTION OF THE DRAWINGS

The figures are not necessarily to scale. Like numbers used in the figures refer to like components. However, it will be understood that the use of a number to refer to a component in a given figure is not intended to limit the component in another figure labeled with the same number.

DESCRIPTION

Figure 1:
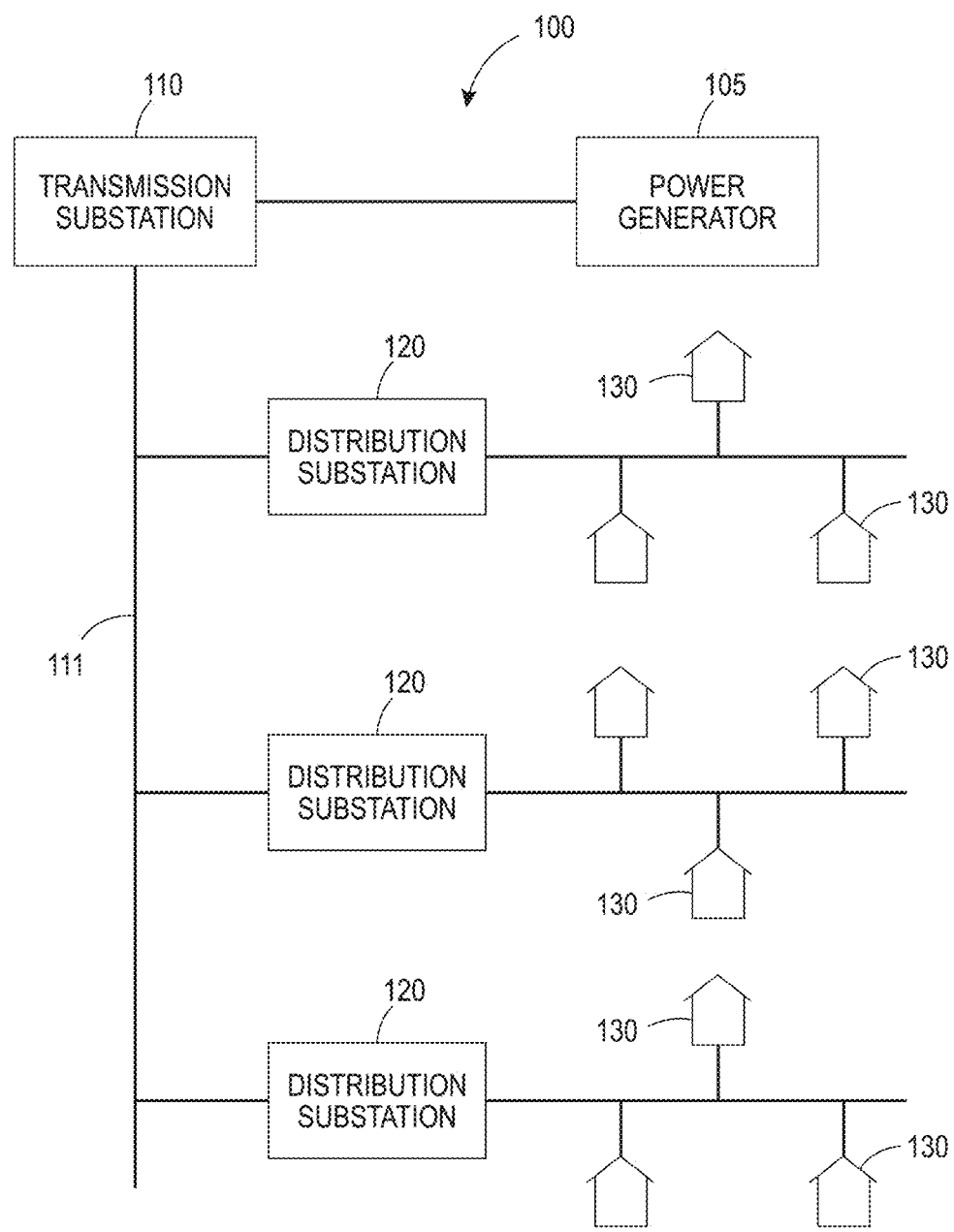
FIG. 1 shows a general block diagram of power grid that may incorporate a monitoring system in accordance with embodiments described herein.

Embodiments described in this disclosure involve optical monitoring systems for power grid components. The impact of manufacturing imperfections, structural degradation, equipment failures, capacity limitations, and natural accidents and catastrophes, which cause power disturbances and outages, can be reduced by online system condition monitoring and diagnostics. The recent increase in distributed energy resources (DER) in the form of plug-in electric vehicles (PEVs), renewable energy and other alternative energy sources also presents new challenges, such as power-grid integration, power system stability, congestion, atypical power flows, and energy storage gaps. There is a growing need for intelligent and low-cost monitoring and control with online sensing technologies to maintain safety, reliability, efficiency, and uptime of the power grid.

However, harsh and complex electric-power-system environments pose great challenges for low-cost sensing in smart-grid applications. Specifically, electrical sensors may be subject to radio frequency interference (RFI), highly caustic/corrosive environments, high moisture/humidity levels, vibrations, dust, or other conditions that challenge performance and/or greatly increase cost. While wireless sensor networks (WSNs) have been explored as a low-cost option in this regard, electromagnetic interference (EMI) effects make it difficult to monitor their communication link quality, thereby limiting usage of WSNs for grids. WSNs also offer additional vulnerabilities to cyber threats.

Embodiments described in this disclosure involve optical monitoring systems for power grid components. The optical monitoring approaches described herein can be used in a monitoring system that monitors any type of power grid component and/or multiple types of power grid components. For example a monitoring system according to the disclosed approaches may monitor electrical power grid components such as power distribution transformers, power transmission transformers, power grid switches, capacitors, relays and/or other power grid components.

Among the power grid components of particular interest, transformers are one of the more expensive pieces of equipment found in a distribution network. Power transmission transformers are designed to step up the voltage from the power distribution plant for long range transmission. Power distribution transformers step down the high voltage from transmission levels to deliver power from high voltage transmission networks to customers. Being relatively simple in construction and at the same time mechanically robust, they offer a long service life. Transformer sustainability has become a growing challenge due to transformer aging and the ongoing trend to supply a growing number of non-linear and variable DER loads through the power transformers. Growing uncertainties in transformer aging result from variable loads and other system complexities due to increasingly high levels of DER.

Variable and non-linear loads can be a factor that accelerates transformer aging. For example, battery chargers for PEVs are high-power devices that employ nonlinear switching which could result in significant harmonic voltage and currents injected into the distribution system. Fast charging, the preferred technique to accelerate PEV adoption, implies precisely these types of nonlinear loads. Simulation models have suggested that some high levels of DER adoption scenarios (such as large numbers of PEVs being fast-charged simultaneously) can significantly accelerate transformer aging. Other types of distributed generation (DG), such as rooftop photovoltaics can possibly extend transformer life in radial networks by relieving them of their peak loads at low to moderate levels of penetration. However, studies suggest that as DG penetration increases, voltage limit violations at transformer secondaries in mesh network-type power distribution systems (common in large metro areas) become increasingly probable.

In transformer designs, the use of oil as an insulation material has become ubiquitous in light of oil enabling superior electrical performance with low losses. However, the flammability of oil-filled transformers can pose major public safety risks, particularly in underground installations as they age and become less robust to transient over-voltages or other internal failure mechanisms. Thus, a need is emerging for low-cost sensing to monitor key internal parameters in transformers, particularly in distribution transformers, for reliable predictions of degradation and/or impending failures.

FIG. 1 is a simplified diagram of a power grid 100. The power grid 100 includes some type of power generator 105 that generates power for the grid, e.g., through burning coal or natural gas, hydroelectric, nuclear, wind, photovoltaics, or other types of power generation. The output voltage from the power generator 105 may be stepped up by transformers at a transmission substation 110 and carried by high voltage transmission lines 111 to one or more power distribution substations 120. The voltage is stepped down by power distribution transformers at the power distribution substations 120 and is provided to houses 130 and/or other facilities connected to the power grid 100. Embodiments discussed in this disclosure are directed to optical systems for monitoring power grid components. For example, the power distribution substations 120 may include one or more optical monitoring systems for power distribution transformers in accordance with embodiments discussed herein. The transmission substation 110 may include one or more optical monitoring systems for power transmission transformers. Although the approaches for power grid monitoring are explained in this disclosure using the example of power transformers as the monitored power grid components, it will be appreciated that the approaches are equally applicable to other components of the power grid.

Figure 2:
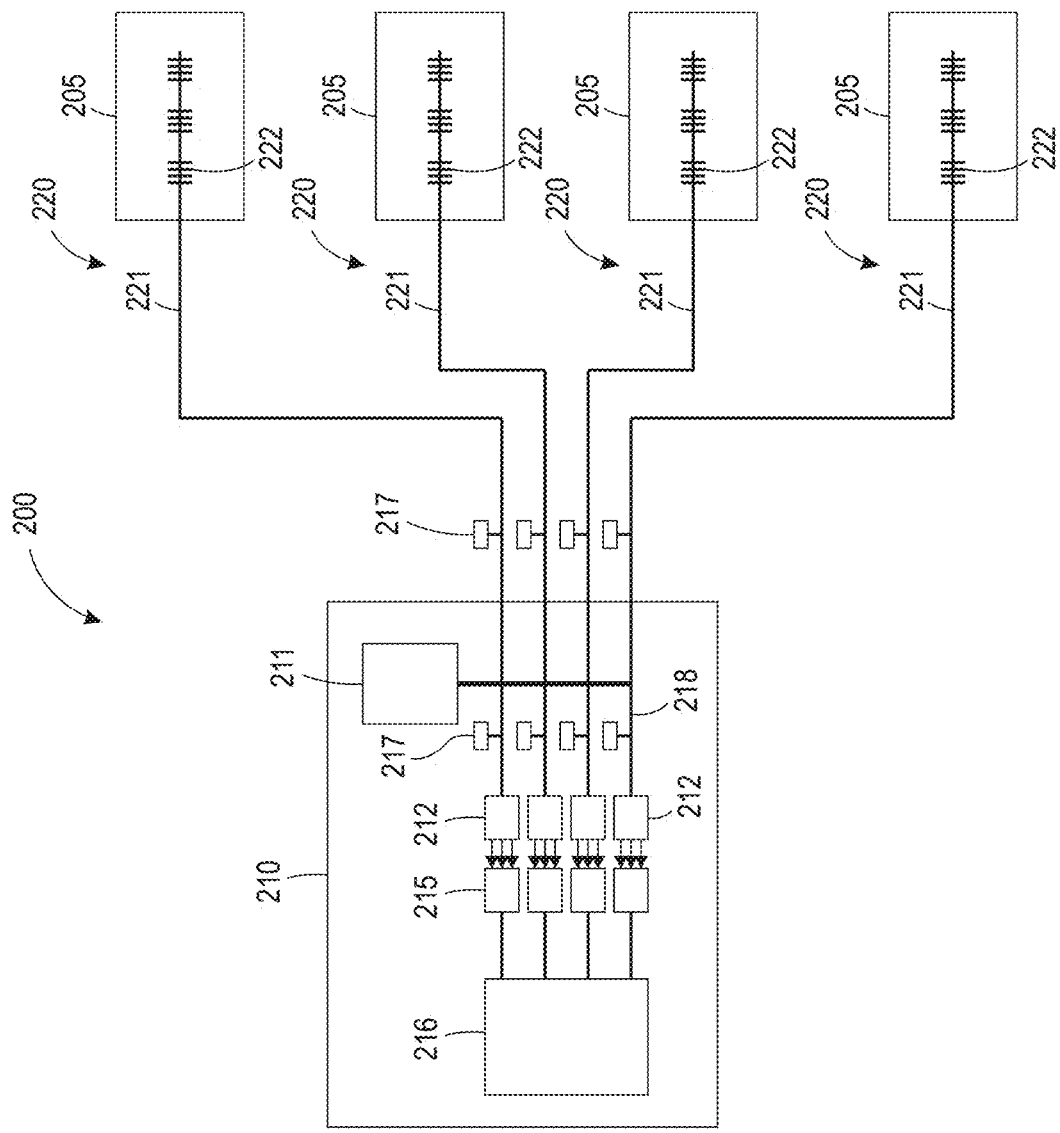
FIG. 2 is a general block diagram of a monitoring system for a power distribution substation in accordance with some embodiments.

FIG. 2 depicts an optical monitoring system 200 that may be arranged to monitor power transformers 205 located at a power grid substation, in accordance with some embodiments. The optical monitoring system 200 includes one or more power transformer monitors 220. Each monitor 220 includes a plurality of optical sensors 222 disposed on one or more optical fibers 221. Each optical sensor 222 is disposed at a location within or on a corresponding power transformer and is configured to sense parameters of the power transformer 205. The parameters sensed may be internal parameters, such as strain, temperature, vibration, chemistry, or operational parameters, such as voltage and current. In some embodiments, each optical sensor may sense a different parameter of the transformer than other optical sensors monitoring the same transformer. In some scenarios two or more of the optical sensors monitoring a transformer may sense the same parameter, for example, to achieve an average of the sensed parameter or to sense the same parameter at different locations of the transformer. In the embodiment depicted in FIG. 2, each transformer 205 is monitored by multiple sensors 222 disposed on a single optical fiber 221. Alternatively, a single transformer may be monitored by multiple sensors disposed on multiple optical fibers and/or multiple transformers may be monitored by multiple sensors disposed on a single optical fiber.

The monitoring system 200 includes control circuitry 210 optically coupled to the optical fibers 221 of the transformer monitors 220. In various embodiments, the control circuitry may be arranged for receiving optical output signals from the optical monitors of one, some, or all of the transformers 205 of the substation.

The control circuitry 210 includes a light source 211 that provides input excitation light to the optical sensors 222. Each of the sensors 222 reflects a portion of the input light as sensor output light. The sensor output light exhibits wavelength shifts of the central wavelength of the sensor according to changes in the sensed parameters of the transformer. In the embodiment shown in FIG. 2, the output light from each sensor 222 that monitors a transformer 205 is multiplexed onto a single optical fiber 221. Thus, the output light from each of the sensors is multiplexed onto the optical fiber 221.

The control circuitry 210 includes an optical wavelength division demultiplexer 212 that spatially distributes the output light carried on the optical fiber 221. A detector unit 215 comprising one or more photodetectors converts the output light into electrical signals representative of the sensed parameters of the transformer.

The wavelength shifts associated with the sensed parameters can be small compared to spacing between the central wavelengths of the sensors. Therefore, it is feasible to separate the optical signals from the individual sensors, referred to as the component signals, using the wavelength division demultiplexer, which may comprise a linear variable filter, arrayed waveguide grating (AWG), or other wavelength dispersive optical element. Alternatively or additionally, a time-domain multiplexing scheme can be employed that operates by exciting short pulses of light in the optical fiber which selectively addresses each of the various sensors. Using various multiplexing configurations, e.g., wavelength division multiplexing/demultiplexing and/or time division multiplexing/demultiplexing, several thousand sensors can be monitored by a single detection unit as described in more detail below.

In some embodiments, the control circuitry 210 includes an analyzer 216 configured to analyze the electrical signals generated by the detector unit 215. The analyzer may be a processor configured to predict, detect, and/or diagnose one or more functional, state, and/or degradation conditions based on analysis of the electrical signals.

Cybersecurity is important for power grid systems. In some embodiments, the monitoring system 200 may include one or more optical sensors 217 coupled to the optical fibers 218 and configured to monitor the optical signals carried on the optical fibers 218 for unusual signal anomalies on that are not attributable to transformer parameters. These security sensors 217 can provide an alert to attacks or other breaches of security. The additional sensors for cybersecurity and/or breach detection may be coupled to the optical fibers 218 within the control circuitry 210 as shown, may be coupled to the optical fibers 221, and/or may cybersecurity and/or breach detection optical sensors may be disposed at both locations.

Figure 3:
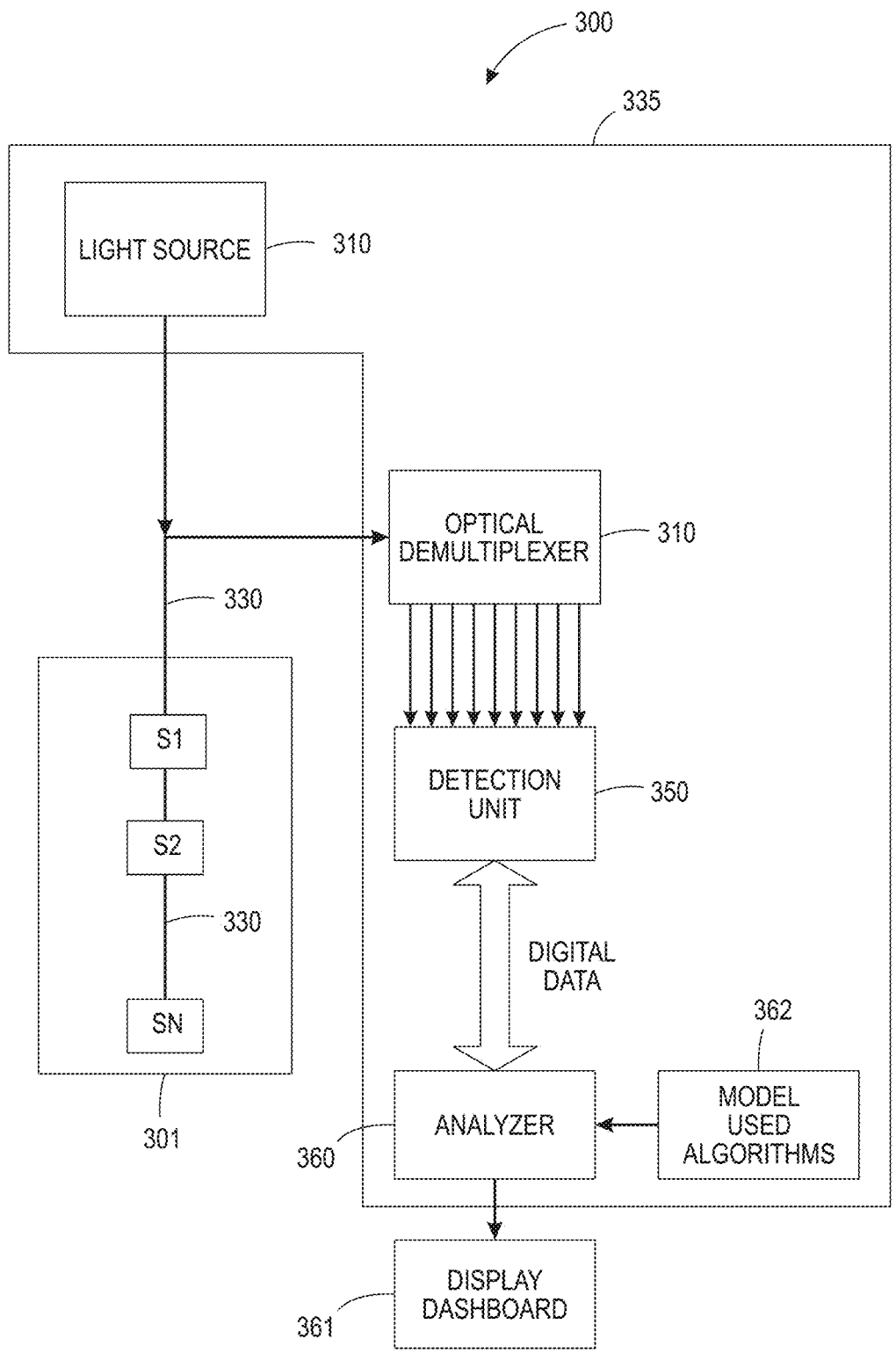
FIG. 3 is a more detailed block diagram of a power grid monitoring system in accordance with some embodiments.

FIG. 3 provides a more detailed view of a monitoring system 300 in accordance with some embodiments. Multiple optical sensors, S1, S2, ... SN, are arranged to respectively sense multiple internal parameters of the transformer 301. Additional internal and/or external sensors may be arranged to monitor operational transformer parameters. For example, internal and/or external sensors may be configured to sense operational parameters of the transformer such as input current, output current, input voltage, output voltage.

Optical sensors can be used to monitor a number of parameters. For example, the optical sensors S1, S2, ... SN may be disposed within or outside the transformer 301 and configured to sense one or more transformer parameters such as temperature, core strain, vibration, presence of various chemicals, corrosion, presence of gas (including dissolved gas such as a hydrogen containing dissolved gas) partial discharge, pressure, current, voltage, and/or other transformer parameters.

The sensors S1, S2, ... SN may comprise any type (or multiple types) of optical sensor, including Fiber Bragg Grating (FBG) sensors and/or etalon or Fabry-Perot (FP) sensors. Both the FBG and etalon/FP sensors are collectively referred to herein as optical sensors or fiber optic sensors. Although some examples provided herein are based on FBG sensors, it will be understood that other types of optical sensors could alternatively or additionally be used in these and other embodiments.

Fiber optic sensors offer many advantages over their electrical counterparts. They are thin, (typically about 100-200 μm) in diameter, lightweight, sensitive, robust to harsh environments, and immune to EMI. Fiber optic sensors can simultaneously measure multiple parameters with high sensitivity in multiplexed (muxed) configurations over long optical fiber cables. Fiber optic sensors have demonstrated robustness to various harsh environments, including long-term (5+ years) exposure to oil-soak environments, as shown for downhole sensing. The most common fiber optic material is silica, which is corrosion resistant, can withstand 1 GPa tension for more than five years, survive, between −200° C. and 800° C., and has a dielectric breakdown strength greater than 470 kV/mm. Various types of plastic are also useful for optical fibers and optical sensors. Fiber optic sensors such as FBG sensors are mechanically robust with respect to shock and vibration. Thus, embedded fiber optic sensors in transformers offer an attractive solution to reliably measure and monitor relevant parameters. In addition, the immunity of optical fiber cables to EMI and radio frequency interference (RFI) make it a particularly suitable communication medium for high voltage operating environments in substations and over long distances across the grid. Thus, the multifunctional nature of optical fiber cables can be exploited to combine sensing, communications, shielding, and lightning protection functions in power systems.

FBG sensors can be formed by a periodic modulation of the refractive index along a finite length (typically a few mm) of the core of the optical fiber. In some embodiments the periodic modulation can be inscribed on the fiber optic through direct writing using femtosecond lasers. The modulation pattern reflects a wavelength, called the Bragg wavelength, that is determined by the periodicity of the refractive index profile of the FBG sensor. In practice, the sensor typically reflects a narrow band of wavelengths centered at the Bragg wavelength. The Bragg wavelength at a characteristic or base value of the external stimulus is denoted $\lambda$ and light having a peak, center, or centroid wavelength $\lambda$ (and a narrow band of wavelengths near $\lambda$) is reflected from the sensor when it is in a predetermined base condition. For example, the base condition may correspond to 25 degrees C. and/or zero strain. When the sensor is subjected to stimulus, the stimulus changes the periodicity of the grating and the index of refraction of the FBG, and thereby alters the reflected light so that the reflected light has a peak, center, or centroid wavelength, $\lambda_s$, different from the base wavelength, $\lambda$. The resulting wavelength shift, $\Delta\lambda/\lambda=(\lambda-\lambda_s)/\lambda$ is a proxy measure of the stimulus.

FBG sensors may be sensitive to changes in refractive index n, strain $\varepsilon_1$, and ambient temperature changes $\Delta T$, for example. The refractive index n can be made sensitive to the chemical environment of the sensor by stripping the optical fiber cladding over the sensor element region and/or by adding appropriate coatings to this sensitive area. Strain and temperature shift the output wavelength of the sensor due to changes in the periodicity of the grating.

The relation between wavelength shift ($\Delta\lambda/\lambda$) and simultaneous strain and temperature in an FBG sensor is:

$$\Delta\lambda/\lambda=\{1-n^2/2[p_{12}-n(p_{11}+p_{12})]\}\varepsilon_1+[\alpha+1/n(dn/dT)]\Delta T \qquad [1]$$

where n is the index of refraction, $p_{11}$ and $p_{12}$ are strain-optic constants, $\varepsilon_1$ is longitudinal strain, $\alpha$ is the coefficient of thermal expansion and T is the temperature. In some implementations, by using multiple FBG sensors that are differently affected by strain and temperature (due to design or mounting), dual fibers or special FBG sensors in combination with data evaluation algorithms, the impacts from strain and temperature on the wavelength shift can be separated. For example, strain and temperature can be separated using a pair of adjacent FBGs at different wavelengths attached to the transformer. One of the two adjacent FBGs can be configured to be sensitive to thermal strain alone using thermally sensitive paste or by enclosing it in a special tubing. The measured wavelength shift of the "reference" FBG sensor in the tubing can be subtracted from the total wavelength shift of the adjacent FBG strain sensor for temperature compensation.

As discussed above, fiber optic sensors are useful for sensing temperature and strain. Vibration can be detected as dynamic strain variations. With suitable coatings and configurations, FBGs and/or other optical sensors can be useful for monitoring current, voltage, chemical environment, and corrosion. For example, some parameters of interest can be mapped to a strain signal on the FBG through special coatings that undergo strain, typically in a linear relationship, in response to the parameter of interest. One or more immediately adjacent optical sensors may be used to compensate for the influence of confounding parameters, such as temperature and/or vibration effects, in order to recover the parameter of interest with high fidelity.

For example, corrosion and/or moisture can be converted into strain signals using suitable coatings and/or by bonding the sensors or sensor coatings to structural components that undergo tensile strain with corrosion.

As another example, chemical sensing can be accomplished by depositing specific chemically sensitive coatings that undergo strain in response to changing concentrations of the chemical species of interest. For example, Palladium (Pd) coatings undergo reversible strain in response to hydrogen-containing gases. Both transformer oil and cellulose have carbon-based molecular structures rich in hydrogen. The decomposition of oil and cellulose forms a large number of byproducts, including combustible and noncombustible gases. Hydrogen is naturally present in most of those compounds. Up to 0.05% volume $H_2$ and short-chain hydrocarbons gas concentration can be an acceptable level for healthy transformers. Optical sensors with Pd coating are useful for detecting hydrogen-based gases. Hydrogen gas sensing with FBGs in free air suggest that Pd-coated FBGs may have about 7 picometer (pm) wavelength shift response for a 1% volume $H_2$ gas concentration change with a response time of about 5 minutes, without accounting for thermal effects. A similar or greater response sensitivity may be achieved for hydrocarbons. With a detection unit resolution of 50 femtometer (fm), a resolution of 0.01-0.02% $H_2$ may be achieved in free air, after accounting for thermal effects. Similar resolution levels may be achievable for dissolved $H_2$ or H-containing gas in oil, enabling a target resolution of about 250 ppm dissolved gas detection.

In some embodiments, the monitoring system disclosed herein can be used for detecting partial discharge of a transformer. A partial discharge causes small electrical sparks to be present in an insulator as a result of the electrical breakdown of a gas (for example air) contained within a void or in a highly non-uniform electric field. The sudden release of energy caused when a partial discharge occurs produces a number of effects, such as chemical and structural changes in the materials surrounding the partial discharge location, electromagnetic signal generation and/or acoustic emission, e.g., in the 50-200 kHz frequency range. With the high frequency monitoring capability enabled by the approaches discussed herein, acoustic emission detection of fast (up to 1 MHz) dynamic strain signals (up to 1.45 fm/$\sqrt{GHz}$) from partial discharge acoustic emission may be achieved and used to detect the occurrence of and/or the severity of the partial discharge.

In the embodiment shown in FIG. 3, the sensors S1, S2, . . . SN are disposed on a single optical fiber 330 that is partially embedded within a transformer 301. Each of the sensors S1, S2, . . . SN may operate within a different wavelength band from other sensors on the optical fiber 330. For example, sensor S1 may operate within a first wavelength band centered at wavelength $\lambda_1$, sensor S2 may operate within a second wavelength band centered at $\lambda_2$, and sensor SN may operate within an Nth wavelength band centered at $\lambda_N$. Each wavelength band $\lambda_1, \lambda_2, \ldots \lambda_N$ may be selected so that it does not substantially overlap with the wavelength bands of the other sensors.

The monitoring system 300 includes control circuitry 335 comprising an input light source 310, optical demultiplexer 340, and detection unit 350. In some embodiments, the control system includes an analyzer 360 implementing model-based algorithms 362.

Optical sensors S1, S2, . . . SN are optically coupled to the input light source 310, which may be a broadband light source that supplies input excitation light across a broad wavelength band that spans the operating wavelength bands of the optical sensors S1, S2, . . . SN. Output light from optical sensors S1, S2, . . . SN is carried on optical fiber 330 to a wavelength domain optical demultiplexer 340 that spatially disperses light from the optical fiber 330 according to the wavelength of the light. In various implementations, the optical demultiplexer may comprise a linearly variable transmission structure and/or an arrayed waveguide grating, or other optically dispersive element.

In configurations that include multiple transformers, the optical signals from each of the transformer monitors (which may each include sensors S1 through SN) can be coupled through an optical time multiplexer (not shown in FIG. 3) to the optical demultiplexer 340. The use of optical time multiplexers is discussed in greater detail below.

Light from the demultiplexer 340 is optically coupled to a detection unit 350 which may comprise one or more photodetectors. Each photodetector is configured to generate an electrical signal in response to light that falls on a light sensitive surface of the photodetector. The electrical signals generated by the photodetectors of the detection unit 350 are representative of the parameters sensed by sensors S1, S2, . . . SN. The optical demultiplexer 340 used in conjunction with the detection unit 350 allows the sensor signal from each of the sensors S1, S2, . . . SN to be individually detected.

The electrical signals generated by the detection unit 350 can be used by the analyzer 360 to analyze (predict, detect and/or diagnose) one or more of a functional condition, a state, and/or a degradation condition of the power transformer 301 based on analysis of the electrical signals. Examples of a state of a power transformer can include the load level of the transformer or the temperature of the transformer. Examples of a functional condition includes actual age of transformer, expected time of service based on expected load levels, present load capacity, etc. Examples of a degradation condition include short circuit, excessive dissolved gases, partial discharge events, corrosion, etc.

Predicting a state or condition is used herein to express making an estimate that the state or condition will happen at a future time. Prediction may involve an estimate of the future time that the state or condition is expected to occur. Detecting a state or condition involves detecting that the state or condition is currently present or absent. Diagnosing a state or condition may identify the degree to which the state or condition is present and/or may identify the cause or causes of the state or condition. In some embodiments, the analysis can be used to schedule maintenance and/or to control operation of the power transformer and/or other components of the power grid.

The sensed parameters, as represented by the electrical signals from the sensors, can be used in conjunction with theoretical and/or empirical transformer models and model-based algorithms 362 for real-time estimation of the transformer state, various degradation conditions and/or various functional conditions, for example. The models can be adapted based on detected conditions of the transformer, measures of internal and/or external parameters and/or correlations between the operational conditions and measured parameters.

The availability of real-time transformer state variables through the disclosed monitoring system can significantly alleviate many of the problems with grid asset monitoring and grid distribution management. The model-based algorithms can correlate sensed parameter values and/or trends with transformer degradation conditions. As one example, consider dissolved gas concentration which can be correlated to safety-critical and performance effects that occur due to degradation in the oil and insulation caused by high temperatures and/or other aging factors. Gas evolution is exacerbated in the presence of other transformer faults such as partial discharges. Thus, dissolved gas levels are reflective of long-term changes in the transformer health due to high temperatures (ambient or from high load operation), cycling under variable distributed energy resource loads, and storage. The monitoring system disclosed herein can provide information about transformer degradation based on dissolved gas sensing. The algorithms executed by the analyzer may take into account trends of dissolved gas sensing as well as temperature and/or cycling trends to make predictions about a future degradation state of the transformer and/or the rate of transformer degradation.

As an additional example, consider another parameter of potential interest, coil strain. Coil strain can be separated into two factors: (a) ohmic and hysteresis-related heating leading to thermal expansion, and (b) magnetostrictive elastic (magnetoelastic) deformation induced by the load level within the core. Because thermal expansion is a slower process than magnetoelastic deformation from the core expansion cycles, mechanical equilibrium is established much faster than thermal. The thermal strain can be isolated from the magnetoelastic deformation using a tubing, for example, as mentioned earlier. As an alternative implementation, core thermal expansion can be modeled. Heat generated by hysteresis losses and electrical resistance in windings produces repetitive thermal expansion and contraction of the materials. The optically sensed temperature may be used as an input to the thermal strain model to determine the temperature induced strain. This value can be subtracted from the total strain to isolate magnetoelastic strain.

Isolation of the thermal strain can allow the residual magnetoelastic strain to act as a snapshot of the load level of the transformer. Core in-plane strain values in the range of about 5-50με can be expected based on typical results from numerical simulations. With higher distributed energy resource penetration leading to more variable loading conditions, the response behavior of the coil strain under inrush currents can be used to predict the transformer's ability to function reliably under a range of variable DER scenarios, including two-way flows from high levels of distributed generation.

Inelastic strain behavior, acoustic emission, vibrations, and/or dynamic oscillations may be generated during partial discharge or coil short circuit events. Partial discharge and short circuits can be detected based on sensing inelastic strain, acoustic emission, vibrations, and/or dynamic oscillations.

Unusual vibrations can also result from core structural issues. Thus, parameters such as coil strain and/or vibration, which change with loads, can correlate to loading on the transformer while dynamic events offer incipient failure indications.

It is possible for mechanical stresses originating from the grid (e.g. higher harmonics in loads) or the operating environment (e.g. seismic events or neighboring construction activity) to be transmitted to the transformer core through the transformer mounts. These stresses might induce additional strains and sensor readings that are not accounted for by the model and confound the parameters sensed by the sensors. A control optical strain sensor can be placed on the transformer enclosure. The output of the control sensor can be used to compensate sensed parameters signals of interest from external sources of strain.

Optically sensing changes in magnetoelasticity, dissolved gas evolution, incidence of partial discharge events and/or other parameters, such as those discussed herein, and trending the parameters over time can give useful metrics for transformer health and prognosis. For example, present values of one or more parameters and/or the rates of change of trends of the one or more parameters can be compared to threshold present values and/or trend values (e.g., slopes) as an indication of transformer health and/or to predict the likelihood of a degradation state and/or safety event, e.g., such as a transformer coil short circuit.

A probabilistic regression analysis, such as relevance vector machines, can be applied to a machine learning approach to develop the models employed by the model-based algorithms for the detection, prediction, and/or diagnosis of the transformer operational state. The machine learning algorithms can collect data via laboratory training conditions and/or conditions experienced by transformers deployed in the field. The machine learning algorithms employed may use probabilistic kernels to reject the effects of outliers and the varying number of data points under different operational conditions that can bias conventional curve fitting methods. The probabilistic techniques can also leverage Bayesian learning to manage system uncertainty.

The models and/or model-based algorithms may be adapted over time through continued machine learning. A variety of filtering techniques are applicable here. Efficient non-linear filters that combine Bayesian learning with importance sampling to provide good state-tracking performance are suitable for this task. The model-based algorithms that are tuned during the tracking phase, can then be propagated for expected loads to give short or long-term prognosis for the transformer.

In some scenarios, information acquired or developed by the analyzer 360 may be provided to an operator via an electronic or printed report. For example, the analyzer 360 may compile, analyze, trend, and/or summarize the sensed parameters, and/or may perform other processes using the sensed parameters as input, such as predicting and/or diagnosing the state of the transformer 301. The results of these analyses and/or other information derived from monitoring the transformer 301 may be provided in a report that can be displayed graphically, textually and/or in any convenient form to an operator and/or may be provided to another computer system for storage in a database and/or further analysis and/or to update the predictive models and/or model-based algorithms. In some configurations, the information derived from the transformer monitoring can be provided to the operator of the power grid through a graphical user interface that includes a dashboard 361 presented on a display. The display dashboard allows for accessing and configuring reports and/or graphs regarding the status of individual transformers, multiple transformers and/or other grid components.

In some embodiments one or more of the optical demultiplexer, detection unit and analyzer can be implemented as an integrated component at a substation which is interoperable with substation automation systems (SAS). The integrated component can handle one or more multiplexed embedded optical sensors within one or more power transformers.

Optical sensor-based sensing as illustrated in FIG. 3 allows for incorporating multiple sensing elements, e.g., about 8 sensors, on a single optical fiber. In some approaches, each of the sensors S1, S2, . . . SN can be individually interrogated through wavelength domain multiplexing and demultiplexing. In some approaches, as illustrated below, sensors disposed in multiple sensor modules can be individually interrogated through a combination of time domain multiplexing and wavelength domain multiplexing and demultiplexing.

In some implementations, both ends of the sensor waveguide 330 disposed within a transformer may be optically coupled to the light source 310 and the optical demultiplexer 340 through optical switches (not shown in FIG. 3). Coupling both ends of the optical fiber may be useful in the event of a broken optical fiber. For example, consider the scenario wherein the optical fiber 330 breaks in two portions between sensors S1 and S2, but both ends of the optical fiber 330 are connected to the light source 310 and optical coupler 340 via optical switches. In this example, an optical fiber initially included all the sensors S1 through SN, but after the breakage, sensors S1 through SN can be considered to be disposed on two FO cables. Even with the broken optical fiber, all sensors S1 through SN remain accessible through the two portions of the optical fiber if both ends of the optical fiber are selectably optically coupled to the light source 310 and optical demultiplexer 340 through an optical switch. The sensors on each portion of the broken optical fiber are accessible by time multiplexing the signal from the optical fiber portions. In the scenario outlined above, the signal from sensor S1 would be accessible through a first portion of broken optical fiber when the optical switches are in the first state and the signals from sensors S2 through SN would be accessible through the second portion of the broken optical fiber when the optical switches are in the second state.

In some embodiments the analyzer 360 may be capable of detecting that an optical fiber is broken, e.g., based on an absence of a signal at the wavelengths of the inaccessible sensors. If the analyzer detects a broken optical fiber, the analyzer may initiate monitoring of all sensors of the optical fiber through both portions of the broken optical fiber. Coupling both ends of the optical fiber may be useful in the implementation wherein only one sensor is disposed on the optical fiber. For example, consider the scenario wherein the optical fiber only includes S1. If the optical fiber breaks between the light source and optical demultiplexer and S1, then S1 would be inaccessible unless both ends of the FO cable are optically coupled to the light source and optical demultiplexer as discussed above.

Figure 4:
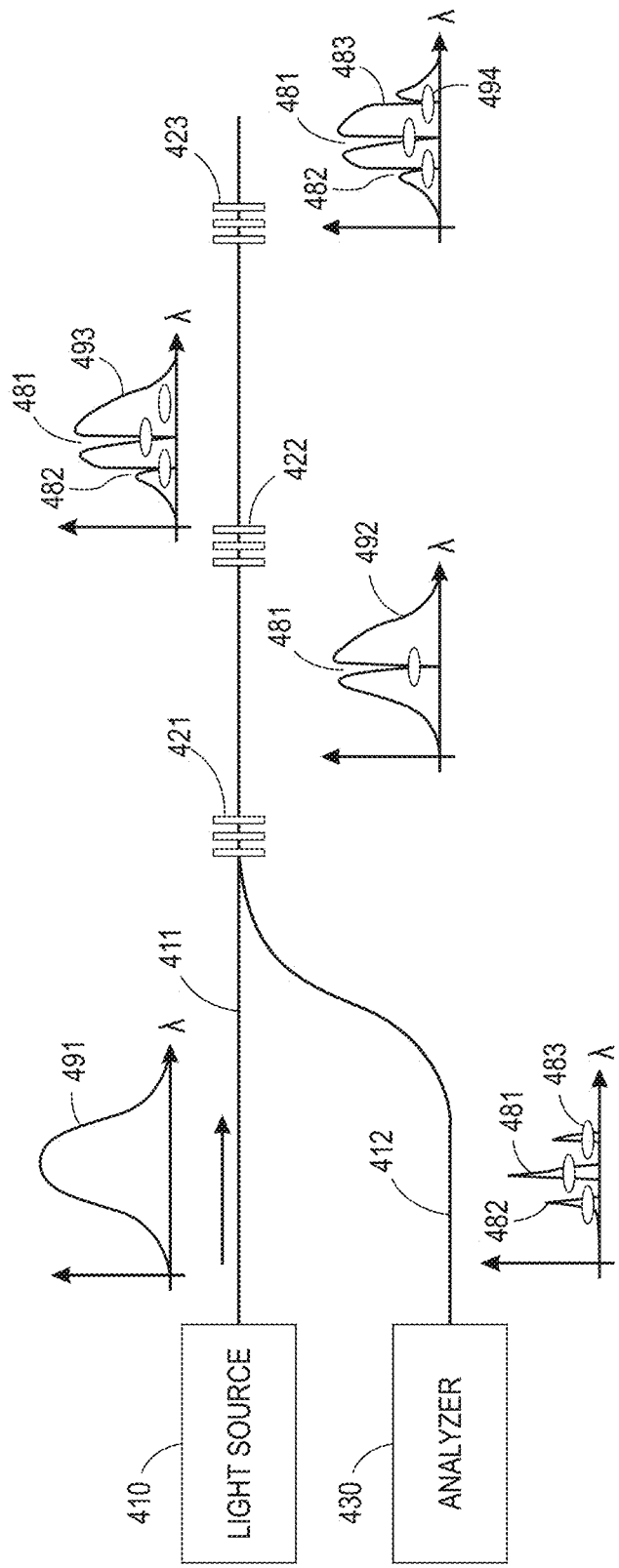
FIG. 4 illustrates reflected spectra for fiber Bragg grating (FBG) sensors used in a monitoring system in accordance with some embodiments.

Turning now to FIG. 4, the operation of a monitoring system that monitors multiple parameters of a transformer with sensor outputs multiplexed using optical wavelength division multiplexing and demultiplexing is illustrated. Broadband light is transmitted by the light source 410, which may comprise or be a light emitting diode (LED) or superluminescent laser diode (SLD), for example. The spectral characteristic (intensity vs. wavelength) of the broadband light is shown by inset graph 491. The light is transmitted via the optical fiber 411 to the first FBG sensor 421. The first FBG sensor 421 reflects a portion of the light in a first wavelength band having a central or peak wavelength, $\lambda_1$. Light having wavelengths other than the first wavelength band is transmitted through the first FBG sensor 421 to the second FBG sensor 422. The spectral characteristic of the light transmitted to the second FBG sensor 422 is shown in inset graph 492 and exhibits a notch at the first wavelength band centered at $\lambda_1$ indicating that light in this wavelength band is reflected by the first sensor 421.

The second FBG sensor 422 reflects a portion of the light in a second wavelength band having a central or peak wavelength, $\lambda_2$. Light that is not reflected by the second FBG sensor 422 is transmitted through the second FBG sensor 422 to the third FBG sensor 423. The spectral characteristic of the light transmitted to the third FBG sensor 423 is shown in inset graph 493 and includes notches centered at $\lambda_1$ and $\lambda_2$.

The third FBG sensor 423 reflects a portion of the light in a third wavelength band having a central or peak wavelength, $\lambda_3$. Light that is not reflected by the third FBG sensor 423 is transmitted through the third FBG sensor 423. The spectral characteristic of the light transmitted through the third FBG sensor 423 is shown in inset graph 494 and includes notches centered at $\lambda_1$, $\lambda_2$, and $\lambda_3$.

Light in wavelength bands 481, 482, 483, having central wavelengths $\lambda_1$, $\lambda_2$ and $\lambda_3$ (illustrated in inset graph 495) is reflected by the first, second, or third FBG sensors 421, 422, 423, respectively, along the FO cables 412 to the analyzer 430. The analyzer 430 may compare the shifts in each the central wavelengths $\lambda_1$, $\lambda_2$ and $\lambda_3$ and/or wavelength bands reflected by the sensors 421-423 to a characteristic base wavelength (a known wavelength) to determine whether changes in the parameters sensed by the sensors 421-423 have occurred. The analyzer 430 may determine that the one or more of the sensed parameters have changed based on the wavelength analysis and may calculate a relative or absolute measurement of the change.

In some cases, instead of emitting broadband light, the light source may scan through a wavelength range, emitting light in narrow wavelength bands to which the various sensors disposed on the FO cable are sensitive. The reflected light is sensed during a number of sensing periods that are timed relative to the emission of the narrowband light. For example, consider the scenario where sensors 1, 2, and 3 are disposed on a FO cable. Sensor 1 is sensitive to a wavelength band (WB1), sensor 2 is sensitive to wavelength band WB2, and sensor 3 is sensitive to WB3. The light source may be controlled to emit light having WB1 during time period 1 and sense reflected light during a time period 1a that overlaps time period 1. Following time period 1a, the light source may emit light having WB2 during time period 2 and sense reflected light during time period 2a that overlaps time period 2. Following time period 2a, the light source may emit light having WB3 during time period 3 and sense reflected light during time period 3a that overlaps time period 3. Using this version of TDM, each of the sensors may be interrogated during discrete time periods.

The FO cable used for energy storage/power system monitoring may comprise a single mode (SM) FO cable or may comprise a multi-mode (MM) FO cable. While single mode fiber optic cables offer signals that are easier to interpret, to achieve broader applicability and lower costs of fabrication, multi-mode fibers may be used.

A major challenge of FBG and other wavelength-based FO sensors is that the obtained wavelength shifts are typically very small. Sub-picometer wavelength measurement resolution is the key for achieving high sensitivity. At the same time, it is desirable to maintain this capability over a wide spectral range. Additionally, high-speed detection enables monitoring of higher frequency vibration/acoustic signals. The detection units described herein use wavelength shift detectors that can resolve wavelength shifts as small as 50 femtometers, for example.

In some embodiments, the detector unit comprises position-sensitive photodetectors and the optical demultiplexer comprises a detector coating that has laterally varying transmission properties, a laterally varying transmission structure (LVTS). The coating converts the wavelength information of the incident light into a spatial intensity distribution, which can be detected with high precision with a position-sensitive photodetector. Differential read-out of the photodetector allows the determination of the centroid of the light distribution. The approach used by the optical demultiplexer and detection unit converts wavelength shifts into a simple centroid detection scheme, allowing for higher resolution wavelength shift detection and cut off frequency for monitoring optical signals.

Figure 5:
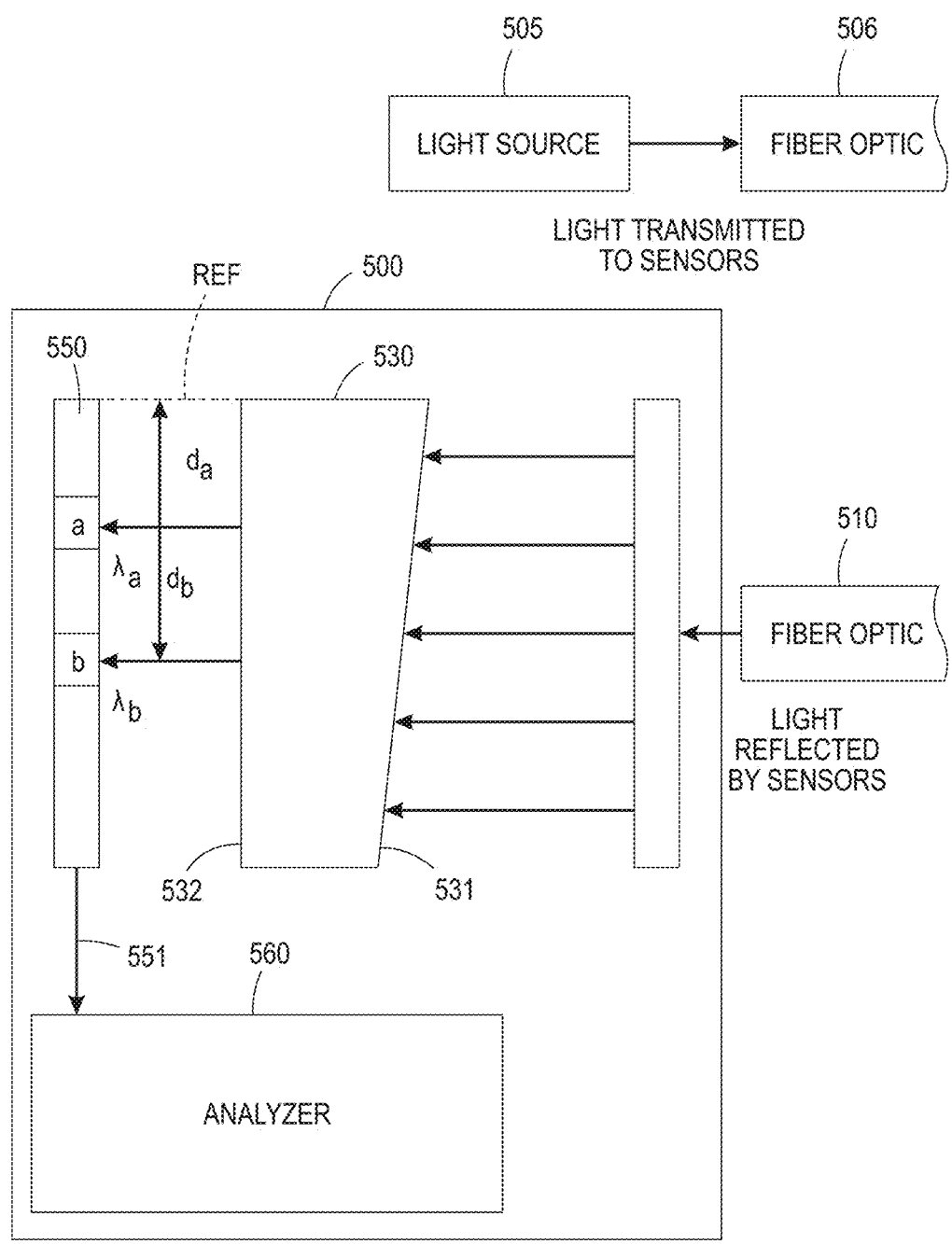
FIG. 5 is a block diagram showing portions of a detection unit and analyzer used to detect changes in sensed parameters in accordance with some embodiments.
Figure 6:
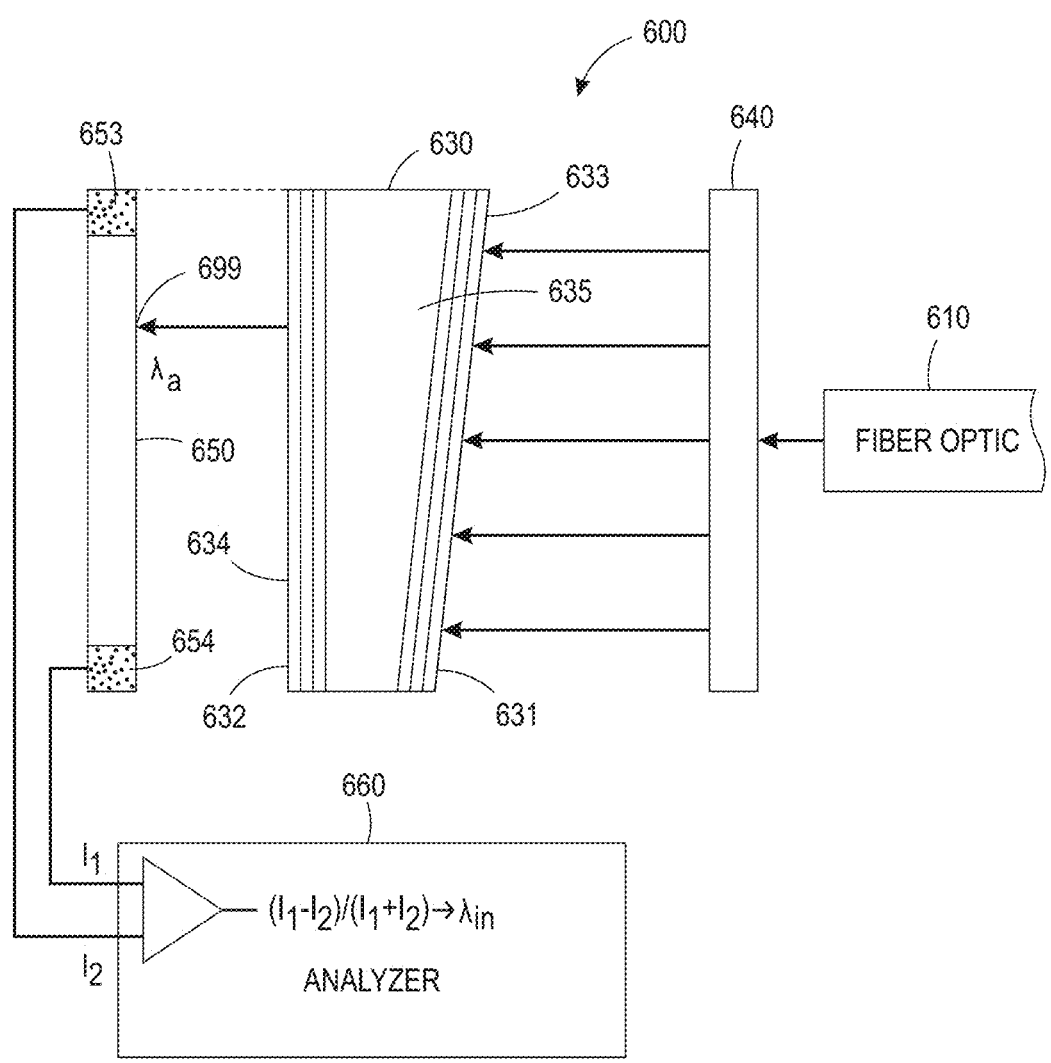
FIG. 6 is a block diagram showing portions of a detection unit and analyzer that uses a non-pixelated photosensitive detector in accordance with some embodiments.

As described in more detail in conjunction with FIG. 5 and FIG. 6, in some embodiments, the output light from the monitor is routed through a linear optical variable filter which serves as the optical wavelength demultiplexer. Only wavelengths within a particular range are transmitted and collected by one or more photodetectors of the detection unit. The difference of the sensor signals renders the signal independent of the strength of the light source. This makes it relatively robust to noise source fluctuations. As a result, the output voltage is proportional to the spatial distribution of the light.

FIG. 5 is a block diagram illustrating portions of the control circuitry 500 of a transformer monitoring system that may be used to detect and/or interpret optical signals received from an MM or SM FO cable having multiple optical sensors arranged at locations in, on or about a power transformer. The light source 505 provides input excitation light to the sensors via optical fiber 506. The control circuitry 500 includes various components that may optionally be used to detect a shift in the wavelength of light reflected by the sensors and propagated by optical fiber 510. The control circuitry 500 optionally includes a spreading component 540 configured to collimate and/or spread the light from the optical fiber 510 across an input surface of LVTS 530. In arrangements where sufficient spreading of the light occurs from the optical fiber, the spreading component may not be used. The LVTS 530 may comprise a dispersive element, such as a prism, or linear variable filter. The LVTS 530 receives light at its input surface 531 (from the optical fiber 510 and (optionally) the spreading component 540) and transmits light from its output surface 532. At the output surface 532 of the LVTS 530, the wavelength of the light varies with distance along the output surface 532. Thus, the LVTS 530 serves to demultiplex the optical signal incident at the input surface 531 of the LVTS 530 according to the wavelength of the light.

FIG. 5 shows two wavelength bands (called emission band) emitted from the LVTS 530, a first emission band has a central wavelength of $\lambda_a$ emitted at distance da from a reference position (REF) along the output surface 532. The second emission band has a central wavelength kb and is emitted at distance $d_b$ from the reference position. A position sensitive detector (PSD) 550 is positioned relative to the LVTS 530 so that light transmitted through the LVTS 530 falls on the PSD. For example, light having wavelength $\lambda_a$ falls on region a of the PSD 550 and light having wavelength kb falls on region b of the PSD 550. The PSD generates an electrical signal along output 551 that includes information about the position (and thus the wavelength) of the light output from the LVTS. The output signal from the PSD is used by the analyzer 560 to detect shifts in the wavelengths reflected by the sensors.

The PSD may be or comprise a non-pixelated detector, such as a large area photodiode, or a pixelated detector, such as a photodiode array or charge coupled detector (CCD). Pixelated one-dimensional detectors include a line of photosensitive elements whereas a two-dimensional pixelated detector includes an n×k array of photosensitive elements. Where a pixelated detector is used, each photosensitive element, corresponding to a pixel, can generate an electrical output signal that indicates an amount of light incident on the element. The analyzer 560 may be configured to scan through the output signals to determine the location and location changes of the transmitted light spot. Knowing the properties of the LVTS allows determining peak wavelength(s) and shift of the peak wavelength(s) of the first and/or second emission band. The wavelength shift of the first or second emission band can be detected as a shift of the transmitted light spot at location a orb. This can, for example, be accomplished by determining the normalized differential current signal of certain pixels or pixel groups of the PSD.

For example, consider the example where light spot A having emission band $EB_A$ is incident on the PSD at location a. $I_{a1}$ is the current generated in the PSD by light spot A by pixel/pixel group at location a1 and $I_{a2}$ is the current generated in the PSD by light spot A by pixel/pixel group at location a2. Light spot B having emission band $EB_B$ is incident on the PSD at location b. $I_{b1}$ is the current generated in the PSD by light spot B by pixel/pixel group at location b1 and $I_{b2}$ is the current generated in the PSD by light spot B by pixel/pixel group at location b2.

The normalized differential current signal generated by pixels or pixel groups at locations a1 and a2 can be written $(I_{a1}-I_{a2})/(I_{a1}+I_{a2})$, which indicates the position of light spot A on the PSD. The wavelength of $EB_A$ can be determined from the position of light spot A on the PSD.

Similarly, the normalized differential current signal generated by pixels or pixel groups at locations b1 and b2 can be written $(I_{b1}-I_{b2})/(I_{b1}+I_{b2})$, which indicates the position of light spot B on the PSD. The wavelength of $EB_B$ can be determined from the position of light spot B on the PSD.

FIG. 6 is a block diagram illustrating portions of the control circuitry 600 of a monitoring system that includes a non-pixelated, one-dimensional PSD 650. The control circuitry 600 includes an optional spreading component 640 that is similar to spreading component 540 as previously discussed. The spreading component 640 is configured to collimate and/or spread the light from the optical fiber 610 across an input surface 631 of the LVTS 630. In the implementation depicted in FIG. 10, the LVTS 630 comprises a linear variable filter (LVF) that includes layers deposited on the PSD 650 to form an integrated structure. The LVF 630 in the illustrated example comprises two mirrors, e.g., distributed Bragg reflectors (DBRs) 633, 634 that are spaced apart from one another to form optical cavity 635. The DBRs 633, 634 may be formed, for example, using alternating layers of high refractive index contrast dielectric materials, such as $SiO_2$ and $TiO_2$. One of the DBRs 633 is tilted with respect to the other DBR 634 forming an inhomogeneous optical cavity 635. It will be appreciated that the LVF may alternatively use a homogeneous optical cavity when the light is incident on the input surface at an angle.

The PSD 650 shown in FIG. 6 is representative of a non-pixelated, one-dimensional PSD although two-dimensional, non-pixelated PSDs (and one or two-dimensional pixelated PSDs) are also possible. The PSD 650 may comprise, for example, a large area photodiode comprising a semiconductor such as InGaAs. Two contacts 653, 654 are arranged to run along first and second edges of the semiconductor of the PSD to collect current generated by light incident on the surface of the PSD 650. When a light spot 699 is incident on the PSD 650, the contact nearest the light spot collects more current when compared to the contact farther from the light spot which collects a lesser amount of current. The current from the first contact 653 is denoted $I_1$ and the current from the second contact 654 is denoted $I_2$. The analyzer 660 is configured to determine the normalized differential current, $(I_1-I_2)/(I_1+I_2)$, the position of the transmitted light spot, and therefore the predominant wavelength of the light incident at the input surface 631 of the LVTS 630 can be determined. The predominant wavelength may be compared to known wavelengths to determine an amount of shift in the wavelength. The shift in the wavelength can be correlated to a change in the sensed parameter. In case two emission bands (creating two spatially separated light spots) hitting the detector at the same time the detector is only capable to provide an average wavelength and wavelength shifts for both emission bands. If wavelength and wavelengths shift of both emission bands need to be determined separately the two emission bands need to hit the detector at different time (time multiplexing).

In other embodiments, a two dimensional non-pixelated PSD may be used, with edge contacts running along all four edges. The position of the central reflected wavelength may be determined by analyzing the current collected from each of the four contacts. The control circuitry (see element 335 of FIG. 3) is also referred to as a "read-out" and may be packaged with an onboard excitation light source as a photonic integrated circuit chip with a chip size between 30-60 mm² which can be disposed in a suitable housing, e.g., a TO5 transistor package. For example, a mass-production version of the control circuitry with an on-board light source may fit within a typical integrated optics module having a volume as small as about 7.5 in³ and/or with a weight of less than about 0.1 lbs.

Figure 7:
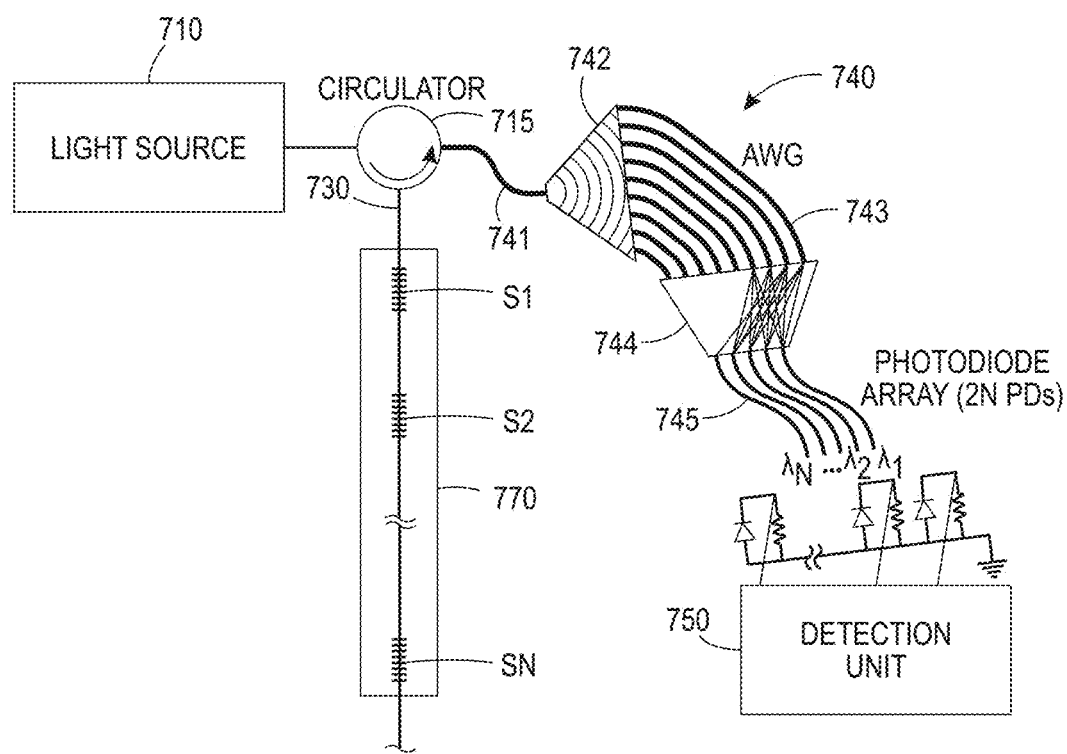
FIG. 7 illustrates wavelength domain multiplexing for multiple sensors using an arrayed waveguide grating (AWG) designed for sensing applications in accordance with some embodiments.

In some embodiments, the wavelength division demultiplexer (see element 212 in FIG. 2) may comprise an arrayed waveguide grating (AWG) as shown in the monitoring system 700 of FIG. 7. FIG. 7 illustrates a power transformer 770 having a number of optical sensors, S1, S2, . . . SN, disposed within, on, or about the power transformer 770. Although only one transformer is shown in FIG. 7, it will be appreciated that a monitoring system may include multiple transformers which are monitored by multiple sensors.

Referring to FIG. 7, S1 operates in a wavelength band having peak, center, or centroid wavelength $\lambda_1$, S2 operates in a wavelength band having peak, center, or centroid wavelength $\lambda_2$, and SN operates in a wavelength band having center wavelength $\lambda_N$. Each sensor may be most sensitive to a different parameter, such that S1 is most sensitive to parameter 1, S2 is most sensitive to parameter 2, and SN is most sensitive to parameter N. A change in parameter 1 may shift the wavelength of the light reflected from S1 from $\lambda_1$ to $(\lambda_1+/-\Delta_1)$, a change in parameter 2 may shift the wavelength of light reflected from S2 from $\lambda_2$ to $(\lambda_2+/-\Delta_2)$, etc. The wavelength shifts caused by changes in the sensed parameters are small compared to the spacing between the characteristic base wavelengths of the individual sensors.

Light source 710 is configured to provide input light to the sensors through circulator 715. The light source 710 has a bandwidth broad enough to provide input light for each of the sensors and over the range of reflected wavelengths expected. The AWG may include N pairs of output waveguides 745, wherein each pair of output waveguides 745 is centered in wavelength around the reflection output of a particular sensor. Light from the light source travels through the circulator and reflects off the sensors as output light. The output light emanating from the sensors is carried on sensor optical waveguide 730 through circulator 715 to the AWG 740 which is used as the optical wavelength domain demultiplexer. When used as an optical demultiplexer, light from the AWG input waveguide 741 is dispersed via diffraction to output waveguides 745 depending on the wavelength of the light. For example, an AWG might have a center wavelength of 1550 nm, and 16 output channels with a channel spacing of 100 GHz (0.8 nm at that wavelength). In this scenario, light input at 1549.6 nm will go to channel 8, and light input at 1550.4 nm will go to channel 9, etc.

An AWG may include an input waveguide 741, a first slab waveguide 742, array waveguides 743, a second slab waveguide 744, and output waveguides 745. Each of the array waveguides 743 is incrementally longer than the next. The input light is broken up in the first slab waveguide 742 among the array waveguides 743. At the output of each array waveguide 743, the light has accrued a wavelength-dependent phase shift, which also is incrementally more from one waveguide to the next. The outputs of the array waveguides 743 resemble an array of coherent sources. Therefore, the propagation direction of the light emitted from the array waveguides 743 into the second slab waveguide 744 depends on the incremental phase shift between the sources and hence the wavelength, as in a diffraction grating.

In some embodiments, the optical coupler, e.g., AWG, the photodiode array and/or the digitizer may be arranged as a planar lightwave circuit, i.e., integrated optical device. For example, these system components may be made from silicon-on-insulator (SOT) wafers using optical and/or electron beam lithography techniques. The planar lightwave circuit can be coupled to the fiber optic, aligned using V-grooves anisotropically etched into the silicon. Hybrid integration with other semiconductors, for example germanium, is possible to provide photodetection at energies below the bandgap of silicon.

In the AWG 740, the outputs of the array waveguides 743 (and hence the input side of the slab waveguide 744) may be arranged along an arc with a given radius of curvature such that the light emanating from them travels in the second slab waveguide 744 and comes to a focus a finite distance away. The inputs of the output waveguides 745 are nominally disposed at the focal points corresponding to specific wavelengths, although they may be set either in front of or behind the foci to deliberately introduce "crosstalk" between the output waveguides as will be described later. Therefore, light at the input 741 of the AWG 740 is passively routed to a given one of the output waveguides 745 depending on wavelength of the light. Thus, the output light from the S1, S2, . . . , SN is routed to output waveguides 745 depending on the wavelength of the output light.

The output waveguides 745 are optically coupled to a detector unit 750 that includes photodetectors, e.g., 2N photodetectors. Due to the wavelength-based spatial dispersion in the AWG, the output light from the sensors S1, S2, . . . SN is spatially distributed across the surface of the detector unit. The photodetectors sense the light from the output waveguides and generate electrical signals that include information about the sensed parameters.

Figure 8A:
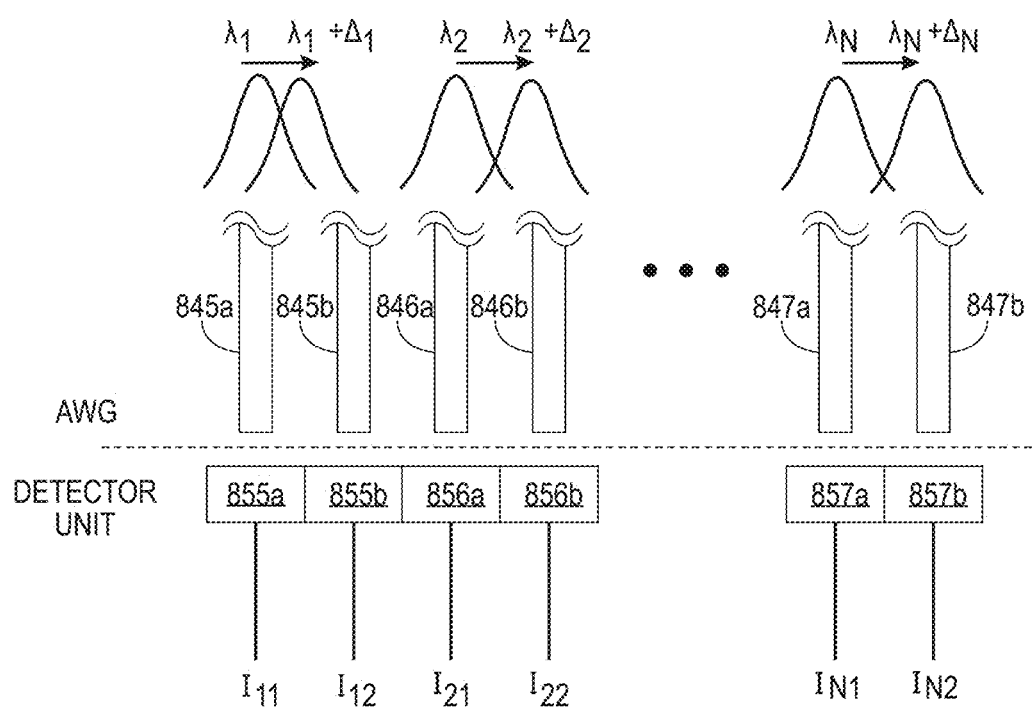
FIGS. 8A, 8B and 9 illustrate in more detail the output waveguides of an AWG used as a wavelength domain optical demultiplexer according to some embodiments.

FIG. 8A illustrates in more detail the output waveguides of an AWG used as a wavelength domain optical demultiplexer (e.g. element 340 of FIG. 3) and a detector unit (e.g., element 350 of FIG. 3) according to some embodiments. In the illustrated configuration 2N photodetectors are respectively coupled to receive light from N sensors. The AWG spatially disperses sensor output light having centroid wavelengths $\lambda_1, \lambda_2, \ldots \lambda_N$ to the output waveguide pairs 845a,b, 846a,b, . . . 847a,b. Sensor output light having centroid wavelength $\lambda_1$ is dispersed to waveguide pairs 845a, 845b; sensor output light having centroid wavelength $\lambda_2$ is dispersed to waveguide pairs 846a, 846b; sensor output light having centroid wavelength $\lambda_N$ is dispersed to waveguide pairs 847a, 847b, etc. Light from output waveguide 845a is optically coupled to photodetector 855a which generates signal $I_{11}$ in response to the detected light; light from output waveguide 845b is optically coupled to photodetector 855b which generates signal $I_{12}$ in response to the detected light; light from output waveguide 846a is optically coupled to photodetector 856a which generates signal $I_{21}$ in response to the detected light; light from output waveguide 846b is optically coupled to photodetector 856b which generates signal $I_{22}$ in response to the detected light; light from output waveguide 847a is optically coupled to photodetector 857a which generates signal $I_{21}$ in response to the detected light; light from output waveguide 847b is optically coupled to photodetector 857b which generates signal $I_{N2}$ in response to the detected light.

As the centroid of a sensor's output light shifts in response to the sensed parameter, the AWG causes the spatial position of the sensor's output light to also shift. For example if sensor output light that initially has a centroid at $\lambda_1$ shifts to a centroid at $\lambda_1+\lambda_1$, as shown in FIG. 8A, the amount of light carried by output waveguide 845a decreases and the amount of light carried by output waveguide 845b increases. Thus, the amount of light detected by photodetector 855a decreases and the amount of light detected by photodetector 855b increases with corresponding changes in the photocurrents $I_1$ and $I_2$. Thus, a shift in the sensed parameter causes a shift in the sensor output light centroid from $\lambda_1$ to $\lambda_1+\Delta_1$ which in turn causes a change in the ratio of $I_{11}$ to $I_{12}$.

The photocurrent of each photodiode may be converted into a voltage with a resistor or transimpedance amplifier, and sensed and digitized. The wavelength shift may be calculated for the $i^{th}$ FBG with the following formula:

$$\lambda_i \approx \lambda_{i0} + \Delta\lambda/2 I_{2i} - I_{2i-1}/I_{2i} + I_{2i-1}$$

Here, $\lambda_i$ is the estimated wavelength of the $i^{th}$ FBG, $\lambda_{i0}$ is the center wavelength of an output waveguide pair, $\Delta\lambda$ is the wavelength spacing between the peak transmission wavelengths of an output waveguide pair, and $I_{2i}$ and $I_{2i-1}$ are the light intensities recorded by the photodetectors at the output of each waveguide in the pair. From the sensed wavelength shift of a given FBG, it is possible to calculate values of sensed parameters, and in turn, to calculate properties of the transformer or other power grid component corresponding to the parameters sensed by the FBG if it is known how those properties tend to vary the observed wavelength shift. In some embodiments, the FBGs have a FWHM roughly equal to $\Delta\lambda/2$, such that as the reflected peak from the FBG shifts from one photodetector in the pair to the other, there is a continuous and monotonic change in the differential signal of the pair (numerator in the formula above).

Figure 8B:
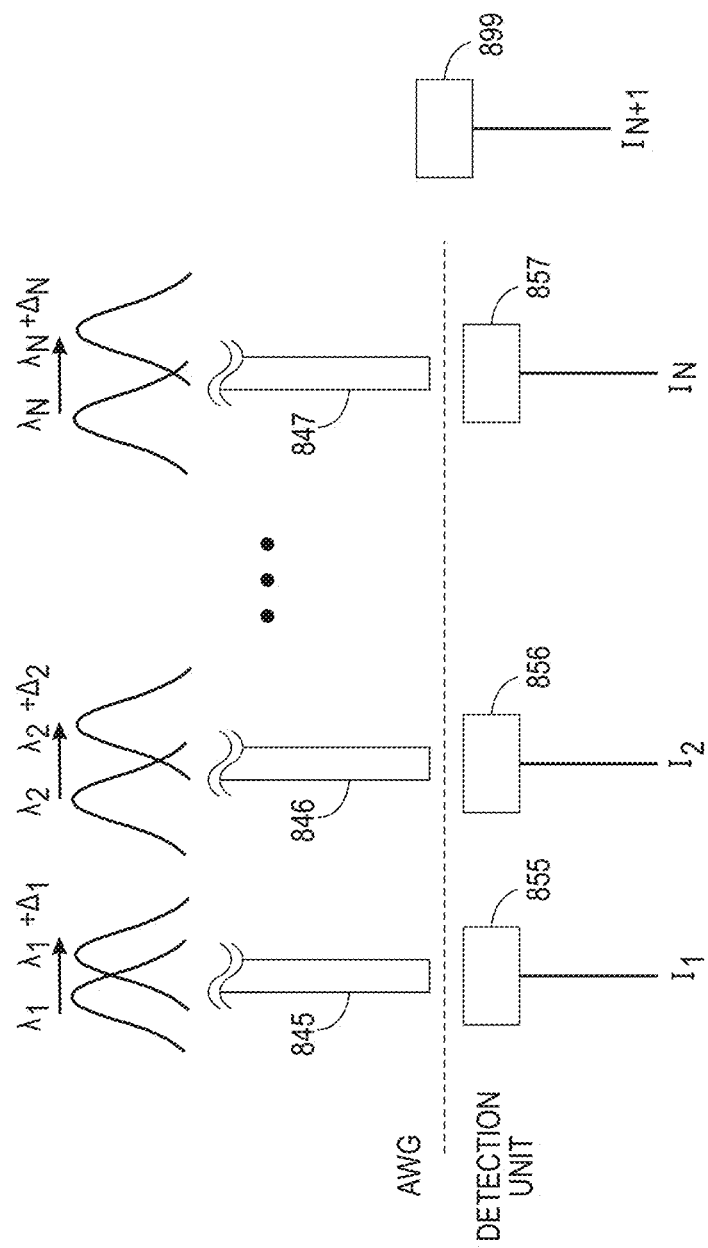

FIG. 8B illustrates in more detail another configuration of the output waveguides of an AWG used as a wavelength domain optical demultiplexer (e.g. element 212 of FIG. 2) and a detection unit (e.g., element 215 of FIG. 2) according to some embodiments. In this configuration N photodetectors are respectively coupled to receive light from N sensors. The AWG spatially disperses sensor output light having centroid wavelengths $\lambda_1, \lambda_2, \ldots \lambda_N$ to the output waveguides 845, 846, . . . 847. Sensor output light having centroid wavelength $\lambda_1$ is dispersed to waveguide 845; sensor output light having centroid wavelength $\lambda_2$ is dispersed to waveguide 846; sensor output light having centroid wavelength $\lambda_N$ is dispersed to waveguide 847, etc. Light from output waveguide 845 is optically coupled to photodetector 855 which generates signal $I_1$ in response to the detected light; light from output waveguide 846 is optically coupled to photodetector 856 which generates signal $I_2$ in response to the detected light; light from output waveguide 847 is optically coupled to photodetector 857 which generates signal $I_N$ in response to the detected light.

As the centroid of a sensor's output light shifts in response to the sensed parameter, the AWG causes the spatial position of the sensor's output light to also shift. For example, if sensor output light that initially has a centroid at $\lambda_1$ shifts to a centroid at $\lambda_1+\Delta_1$ as shown in FIG. 8B, the amount of light carried by output waveguide 845 increases. Thus, the amount of light detected by photodetector 855 increases with a corresponding change in the photocurrent $I_1$. Thus, a shift in the sensed parameter causes a shift in the sensor output light centroid from $\lambda_1$ to $\lambda_1+\Delta_1$, which in turn causes a change in the current $I_1$.

Changes in the photodetector current that are caused by fluctuations of light source intensity (e.g., 310 in FIG. 3) can be differentiated from changes in photodetector current caused by wavelength shifts in sensor output light by measuring the light source intensity with an additional photodetector 899 that generates current $I_{N+1}$. Then, a wavelength shift can be calculated from the ratio $I_1/I_{N+1}$ for sensor 1, $I_2/I_{N+1}$ for sensor 2, etc.

From the sensed wavelength shift of a given sensor, it is possible to calculate a value of sensed parameter, and in turn, to calculate properties of the transformer corresponding to the parameter sensed by the sensor if it is known how those properties tend to vary the observed wavelength shift.

Figure 9:
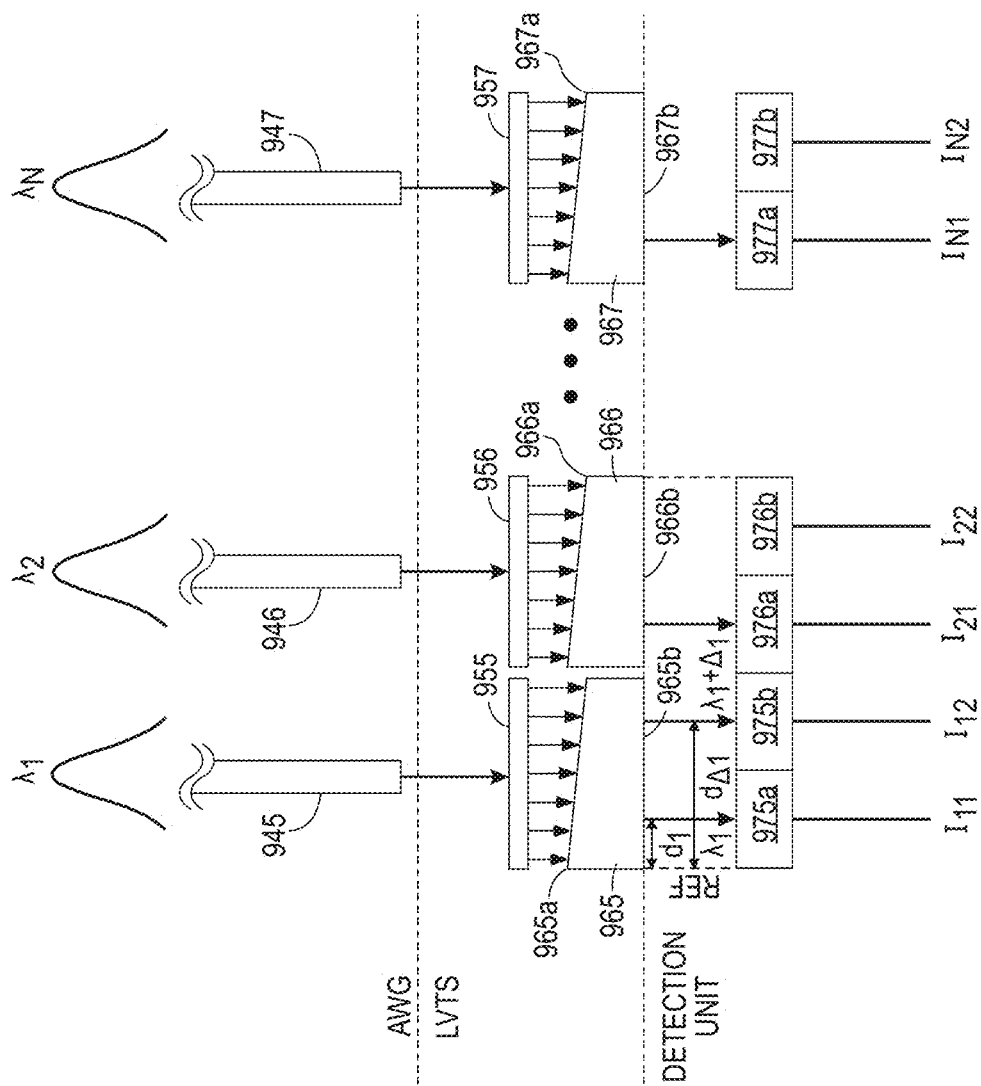

FIG. 9 illustrates in more detail the output waveguides of an AWG used as a wavelength domain optical demultiplexer, an additional dispersive element, and a digitizer according to some embodiments. In this example, the output light from sensors 1, 2 . . . N having initial centroid wavelengths $\lambda_2$, $\lambda_2, \ldots \lambda_N$ is respectively spatially dispersed to output waveguides 945, 946, . . . 947 of the AWG. The light from output waveguides 945, 946, . . . 947 is incident on LVTS 965, 966, . . . 967 or other spatially dispersive optical element.

Optionally, the LVTS includes spreading components 955, 956 . . . 957 configured to collimate and/or spread the light from the output waveguide 945, 946 . . . 947 across an input surface of LVTS 965, 966, . . . 967. In arrangements where sufficient spreading of the light occurs from the output waveguides 945, 946, . . . 947, the spreading components may not be used. The LVTS 965, 966, . . . 967 comprises a dispersive element, such as a prism or a linear variable filter. The LVTS 965, 966, . . . 967 receives light at its input surface 965a, 966a, . . . 967a from the waveguide 945, 946, . . . 947 and the optional spreading component 955, 956, . . . 957 and transmits light from its output surface 965*b*, 966*b*, . . . 967*b* to photodetector pairs 975, 976, . . . 977. At the output surface 965*b*, 966*b*, . . . 967*b* of the LVTS 965, 966, . . . 967, the wavelength of the light varies with distance along the output surface. Thus, the LVTS 965, 966, . . . 967 can serve to further demultiplex the optical signal incident at the input surface 965*a*, 966*a*, . . . 967*a* of the LVTS 965, 966, . . . 967 according to the wavelength of the light.

FIG. 9 shows two wavelength bands emitted from the LVTS 965, an initial emission band has a centroid wavelength of $\lambda_1$ emitted at distance di from a reference position (REF) along the output surface 965*b*. In response to the sensed parameter, the initial wavelength band shifts to a wavelength band having centroid wavelength $\lambda_1 + \Delta_1$. The shifted wavelength band is emitted at distance $d_{\Delta 1}$ from the reference position.

A photodetector pair 975 is positioned relative to the LVTS 965 so that light transmitted through the LVTS 965 falls on the photodetector pair 975. For example, light having wavelength $\lambda_1$ may fall predominantly on photodetector 975*a* and light having wavelength $\lambda_1 + \Delta_1$ may fall predominantly on photodetector 975*b*. The photodetector 975*a* generates signal $I_{11}$ in response to light falling on its light sensitive surface and photodetector 975*b* generates signal $I_{12}$ in response to light falling on its light sensitive surface. The signals $I_{11}$, $I_{12}$ include information about the sensed parameter such that a change in the ratio of $I_{11}$ and $I_{12}$ indicates a change in the sensed parameter, which can be calculated using the equation discussed above.

The high resolution wavelength shift detection schemes discussed above can be extended to monitor tens to thousands of multiplexed sensors while maintaining 50 fm or greater wavelength resolution at an effective sampling rate of 100 Hz. For example, in one embodiment the control circuitry can be configured to monitor eight wavelength multiplexed sensor strings of sixteen sensors with time domain multiplexing, e.g., using an optical switch. In such a configuration 128 sensors can be monitored at 100 Hz. At lower frequencies, up to several thousand sensors can be monitored.

Figure 10:
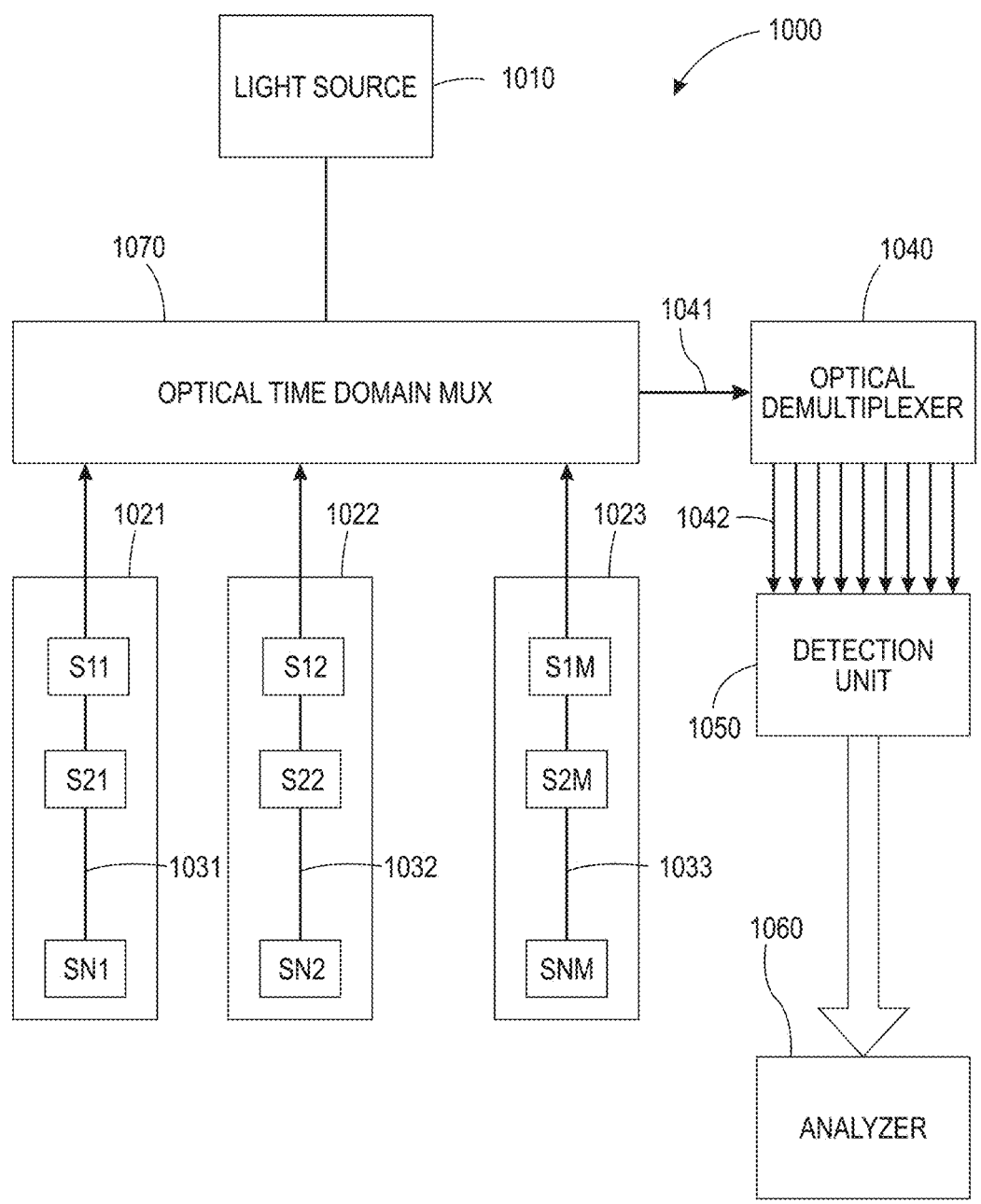
FIG. 10 is a block diagram of a monitoring system that includes both time and wavelength division multiplexing in accordance with some embodiments.

FIG. 10 shows a block diagram of a monitoring system 1000 that incorporates time domain multiplexing to monitor M transformers wherein each transformer monitor 1021, 1022, . . . 1023 includes N sensors. The optical outputs of the N sensors of each transformer monitor 1021, 1022, . . . 1023 may be carried on a single optical fiber 1031, 1032, 1033 where the optical outputs of the sensors are spatially distributed in wavelength by the optical demultiplexer. The optical fibers and/or sensors may be identically constructed.

Input light is passed from the light source 1010 to the N sensors of each transformer monitor 1021, 1022, . . . 1023 through optical time domain multiplexer 1070 and through waveguides 1031, 1032, . . . 1033. The input excitation light interacts with the sensors S11 . . . SNM. Output light from the sensors of the transformer monitors 1021, 1022, . . . 1023 is passed to the optical wavelength domain demultiplexer 1040 through the optical time domain multiplexer 1070. The transformer monitors 1021 (including sensors S11 through SN1), 1022 (including sensors S12 through SNM), . . . 1023 (including sensors S1M through SNM) are selected one at a time by the optical time domain multiplexer 1070. Optical signals from the selected monitor are applied to the optical demultiplexer 1040, detection unit 1050, and analyzer 1060 during different time intervals. Implementations that combine time domain multiplexing and wavelength domain multiplexing and demultiplexing of sensor output light as disclosed herein are able to monitor a greater number of transformers than could be addressed by either time domain multiplexing or wavelength domain multiplexing/demultiplexing alone.

The monitoring system approaches discussed herein can include cybersecurity and interoperability as key built-in functions. For smart grid asset cybersecurity, the vulnerability of the physical, computational, and communications interface layers to deliberate attacks, as well as inadvertent compromises from user errors, equipment failures, and natural disasters are of concern. The disclosed approaches have an inherent advantage over conventional alternatives at least because they are based on optical fiber cables for embedded sensing. The optical fiber cable emerging from the embedded sensing configuration within the transformer is coupled to a modular, dedicated, data-secure communications bus, e.g., using standard optical fiber connectors. The communications bus can transmit the sensed signals directly to a substation control center, e.g., up to 30 km away with 50 fm resolution at 100 Hz. EMI and RFI immunity characteristics make optical fiber communications a desirable long-distance communication bus around substations. Additionally, communications over optical fiber offers shielding and lightning protection functions.

According to some embodiments, the control circuitry, e.g., a photonic chip readout with an onboard light source, is located at a substation directly interfacing with the supervisory control and data acquisition (SCADA) and SAS. With its embedded sensing and model-based algorithms, the control circuitry will monitor optical sensor wavelength shifts for transformer health from the substation. Note that as previously discussed, the control circuitry could potentially monitor multiple transformers of interest and/or could monitor multiple redundant optical fiber cables from the same transformer from a central location using time multiplexing strategies. Monitoring multiple redundant optical fibers from the same transformer may be desirable from a security perspective, for example. Monitoring from a central location eliminates the need for a battery or other energy source at the sensing location. The control circuitry can be powered by the same energy source powering the automation systems in the substation control center. Monitoring from a central location also enhances security because the control circuitry can be physically protected from attack out on the field. Having additional multiplexed reference optical sensors monitoring the communication channels for unusual signal anomalies not attributable to transformer parameters can provide an alert to attacks and/or other breaches of security.

Systems, devices, or methods disclosed herein may include one or more of the features, structures, methods, or combinations thereof described herein. For example, a device or method may be implemented to include one or more of the features and/or processes described herein. It is intended that such device or method need not include all of the features and/or processes described herein, but may be implemented to include selected features and/or processes that provide useful structures and/or functionality.

In the above detailed description, numeric values and ranges are provided for various aspects of the implementations described. These values and ranges are to be treated as examples only, and are not intended to limit the scope of the claims. For example, embodiments described in this disclosure can be practiced throughout the disclosed numerical ranges. In addition, a number of materials are identified as suitable for various implementations. These materials are to be treated as exemplary, and are not intended to limit the scope of the claims.

The foregoing description of various embodiments has been presented for the purposes of illustration and description and not limitation. The embodiments disclosed are not intended to be exhaustive or to limit the possible implementations to the embodiments disclosed. Many modifications and variations are possible in light of the above teaching.

The invention claimed is:

1. A monitoring system comprising:
two or more power transformer monitors of a power grid system, each power transformer monitor comprising a plurality of optical sensors disposed on one or more optical fibers, the optical sensors configured to sense internal parameters of a power transformer, each optical sensor disposed at a location within or on a power transformer and configured to sense an internal transformer parameter that is different from an internal transformer parameter sensed by at least one other sensor of the plurality of optical sensors;
one or more detector units, each detector unit configured to convert optical signals of the optical sensors of a corresponding power transformer monitor to electrical signals representative of the sensed transformer parameters;
shared control circuitry communicatively coupled to each of the power transformer monitors, wherein the control circuitry includes the detector units and the detector units are communicatively coupled to each power transformer monitor by an optical communication channel, wherein the optical communication channel includes an optical sensor configured to detect signal anomalies not attributable to transformer parameters; and
at least one optical coupler disposed between the one or more optical fibers and the detector units, the optical coupler configured to spatially disperse optical signals from the optical sensors according to wavelength.

2. The system of claim 1, wherein at least one of the optical sensors is configured to sense transformer core strain.

3. The system of claim 1, wherein at least one of the optical sensors is configured to sense a dissolved gas.

4. The system of claim 1, wherein at least one of the optical sensors is a Pd-coated fiber Bragg grating.

5. The system of claim 1, wherein at least one of the optical sensors is configured to sense temperature.

6. The system of claim 1, wherein at least one of the optical sensors is configured to sense partial discharge.

7. The system of claim 1, wherein at least one of the optical sensors is configured to sense vibration.

8. The system of claim 1, wherein at least one of the optical sensors is configured to sense a chemical.

9. The system of claim 1, wherein at least one of the optical sensors is configured to sense corrosion.

10. The system of claim 1, wherein at least one of the optical sensors is configured to sense moisture.

11. The system of claim 1, further comprising one or more optical sensor configured to sense an electrical parameter.

12. The system of claim 1, wherein each optical sensor operates within a different wavelength range and emanates output light in response to input light, the output light having a centroid wavelength that changes in response to the sensed internal parameter of the power transformer.

13. The system of claim 1, wherein the optical coupler spatially disperses light according to wavelength.

14. The system of claim 1, wherein the optical coupler comprises a linear variable filter.

15. The system of claim 1, wherein the optical coupler comprises an arrayed waveguide grating.

16. The system of claim 1, further comprising an optical multiplexer disposed between the optical fibers and the optical coupler.

17. The system of claim 16, wherein the optical multiplexer comprises a time division multiplexer, the time domain multiplexer comprising at least one of:
a set of M optical switches; and
a single 1×M optical switch.

18. The system of claim 16, wherein the optical multiplexer comprises a wavelength division multiplexer.

19. A monitoring system comprising:
two or more power grid component monitors for one or more components of a power grid transmission and distribution system, each power grid component monitor comprising a plurality of optical sensors disposed on one or more optical fibers, the optical sensors configured to sense parameters of the power grid component, each optical sensor disposed at a location within or on the power grid component and configured to sense a power grid component parameter that is different from a power grid component parameter sensed by at least one other sensor of the plurality of optical sensors;
one or more detector units, each detector unit configured to convert optical signals of the optical sensors of a corresponding power grid component monitor to electrical signals representative of the sensed power grid component parameters;
shared control circuitry communicatively coupled to each of the power grid component monitors, wherein the control circuitry includes the detection units and the detector units are communicatively coupled to each power grid component monitor by an optical communication channel, wherein the optical communication channel includes an optical sensor configured to detect signal anomalies not attributable to transformer parameters; and
at least one optical coupler disposed between the one or more optical fibers and the detector units, the optical coupler configured to spatially disperse optical signals from the optical sensors according to wavelength.

20. The system of claim 19, further comprising an analyzer configured to analyze the electrical signals and to predict, detect and/or diagnose one or more functional, state, and/or degradation conditions of the power grid components based on analysis of the electrical signals.

* * * * *